United States Patent
Basu et al.

(10) Patent No.: US 9,224,866 B2
(45) Date of Patent: Dec. 29, 2015

(54) SUSPENDED BODY FIELD EFFECT TRANSISTOR

(71) Applicant: GLOBALFOUNDRIES INC., Grand Cayman (KY)

(72) Inventors: Anirban Basu, Elmsford, NY (US); Guy Cohen, Mohegan Lake, NY (US); Amlan Majumdar, White Plains, NY (US); Jeffrey W. Sleight, Ridgefield, CT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/010,589

(22) Filed: Aug. 27, 2013

(65) Prior Publication Data

US 2015/0060997 A1    Mar. 5, 2015

(51) Int. Cl.
*H01L 29/78* (2006.01)
*H01L 29/66* (2006.01)

(52) U.S. Cl.
CPC ........ *H01L 29/785* (2013.01); *H01L 29/66795* (2013.01)

(58) Field of Classification Search
CPC ........................ H01L 29/785; H01L 29/66795
See application file for complete search history.

(56) References Cited

U.S. PATENT DOCUMENTS

| | | | |
|---|---|---|---|
| 5,952,672 A * | 9/1999 | Kikkawa | 257/15 |
| 7,825,481 B2 | 11/2010 | Chau et al. | |
| 8,361,869 B2 | 1/2013 | Zhou et al. | |
| 8,492,235 B2 * | 7/2013 | Toh et al. | 438/300 |
| 2005/0017377 A1 | 1/2005 | Joshi et al. | |
| 2007/0045725 A1 * | 3/2007 | Yun et al. | 257/330 |
| 2008/0191242 A1 | 8/2008 | Detlev | |
| 2008/0224183 A1 * | 9/2008 | Nawaz | 257/279 |

(Continued)

FOREIGN PATENT DOCUMENTS

| | | |
|---|---|---|
| KR | 10-1213702 B1 | 12/2012 |
| WO | 2012159329 A1 | 11/2012 |

OTHER PUBLICATIONS

"Source/Drain Engineering for In0.7Ga0.3As N-Channel Metal-Oxide-Semiconductor Field-Effect Transistors: Raised Source/Drain with in situ Doping for Series Resistance Reduction" Japanese Journal of Applied Physics (Apr. 2011) pp. 04DF01-1-04DF01-4, vol. 50, Issue 4.*

(Continued)

*Primary Examiner* — Marc Armand
*Assistant Examiner* — Younes Boulghassoul
(74) *Attorney, Agent, or Firm* — Scully, Scott, Murphy & Presser, P.C.

(57) ABSTRACT

A semiconductor fin including a vertical stack, from bottom to top, of a second semiconductor material and a first semiconductor material is formed on a substrate. A disposable gate structure straddling the semiconductor fin is formed. A source region and a drain region are formed employing the disposable gate structure as an implantation mask, At least one semiconductor shell layer or a semiconductor cap layer can be formed as an etch stop structure. A planarization dielectric layer is subsequently formed. A gate cavity is formed by removing the disposable gate structure. A portion of the second semiconductor material is removed selective to the first semiconductor material within the gate cavity so that a middle portion of the semiconductor fin becomes suspended over the substrate. A gate dielectric layer and a gate electrode are sequentially formed. The gate electrode laterally surrounds a body region of a fin field effect transistor.

13 Claims, 20 Drawing Sheets

(56) References Cited

U.S. PATENT DOCUMENTS

| | | | |
|---|---|---|---|
| 2009/0294864 A1* | 12/2009 | Suk et al. | 257/368 |
| 2010/0193770 A1* | 8/2010 | Bangsaruntip et al. | 257/24 |
| 2010/0252801 A1* | 10/2010 | Sekaric et al. | 257/9 |
| 2011/0024794 A1* | 2/2011 | Ko et al. | 257/190 |
| 2011/0133169 A1* | 6/2011 | Bangsaruntip et al. | 257/38 |
| 2011/0133280 A1* | 6/2011 | Bangsaruntip et al. | 257/347 |
| 2012/0007051 A1* | 1/2012 | Bangsaruntip et al. | 257/24 |
| 2012/0302014 A1 | 11/2012 | Huang et al. | |
| 2012/0329217 A1 | 12/2012 | Bangsaruntip et al. | |
| 2013/0001591 A1* | 1/2013 | Wu et al. | 257/77 |
| 2013/0005103 A1 | 1/2013 | Liu et al. | |
| 2013/0089958 A1 | 4/2013 | Yeh et al. | |
| 2015/0061013 A1* | 3/2015 | Basu et al. | 257/347 |

OTHER PUBLICATIONS

Gong, X. et al., "Source/Drain Engineering for In0.7Ga0.3As N-Channel Metal-Oxide-Semiconductor Field-Effect Transistors: Raised Source/Drain with in situ Doping for Series Resistance Reduction" Japanese Journal of Applied Physics (Apr. 2011) pp. 04DF01-1-04DF01-4, vol. 50, Issue 4.

Tang, C.W. et al., "Hetero-epitaxy of III-V compounds lattice-matched to InP by MOCVD for device applications" IEEE International Conference on Indium Phosphide & Related Materials (May 10-14, 2009) pp. 136-139.

Zhao, H. et al., "Factors enhancing In0.7Ga0.3As MOSFETs and tunneling FETs device performance" Device Research Conference (DRC) (Jun. 21-23, 2010) pp. 63-64.

Park, D., "3 Dimensional GAA Transitors: twin silicon nanowire MOSFET and multi-bridge-channel MOSFET" 2006 IEEE International SOI Conference Proceedings ( Oct. 2-5, 2006) pp. 131-134.

Office Action dated Dec. 18, 2014 received in U.S. Appl. No. 14/010,585.

* cited by examiner

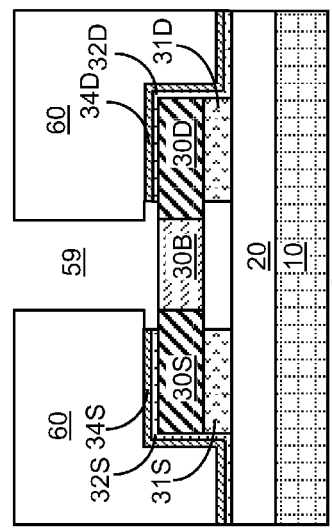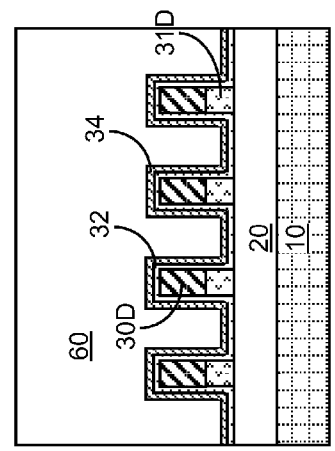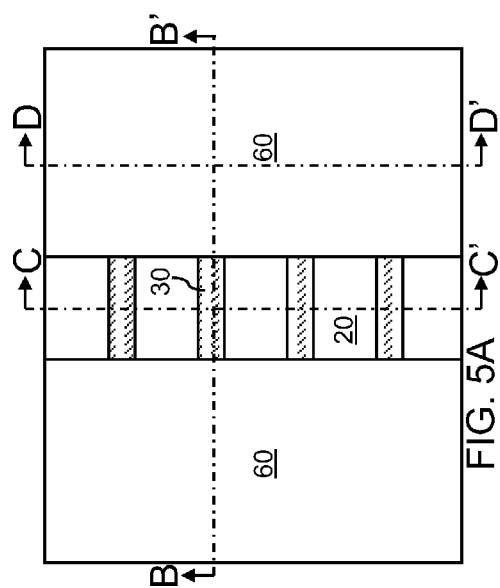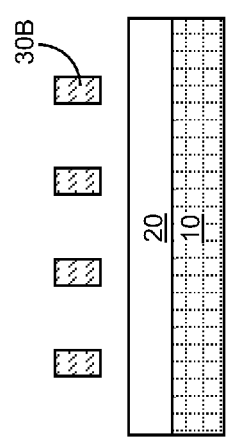

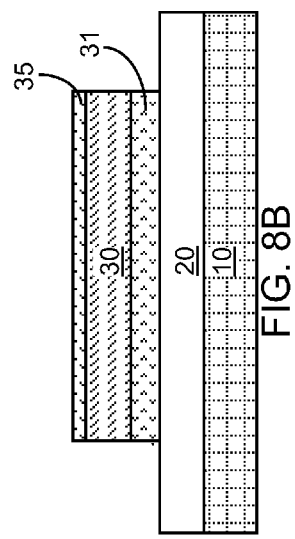
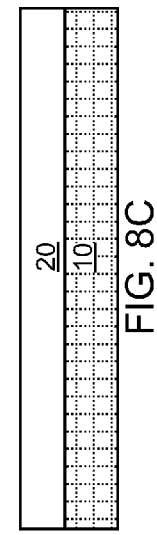
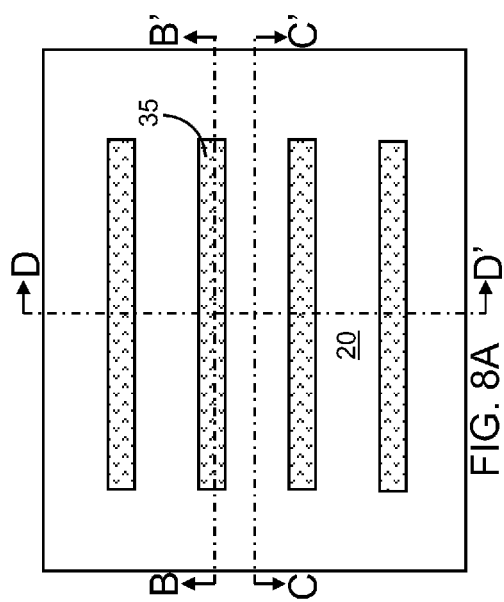
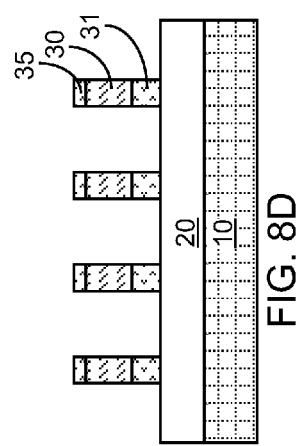
FIG. 8B
FIG. 8C
FIG. 8A
FIG. 8D

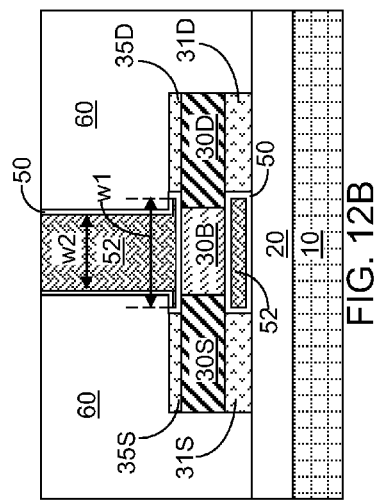
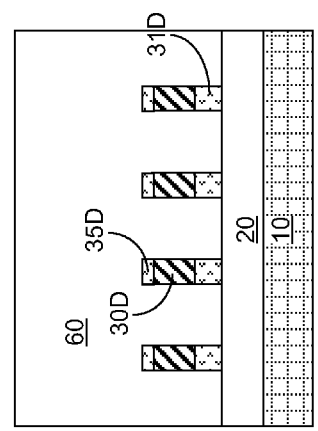
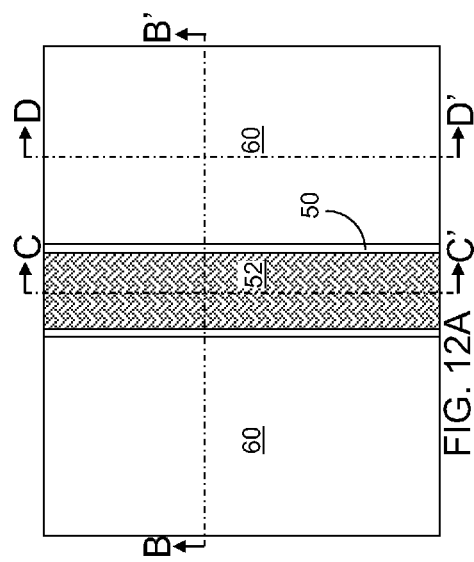
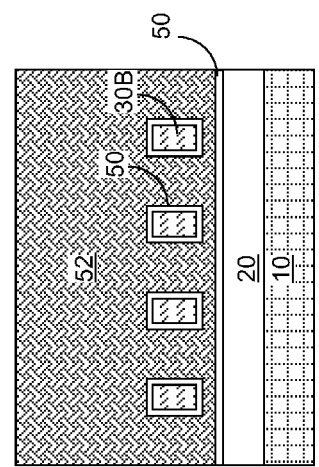
FIG. 12A
FIG. 12B
FIG. 12C
FIG. 12D

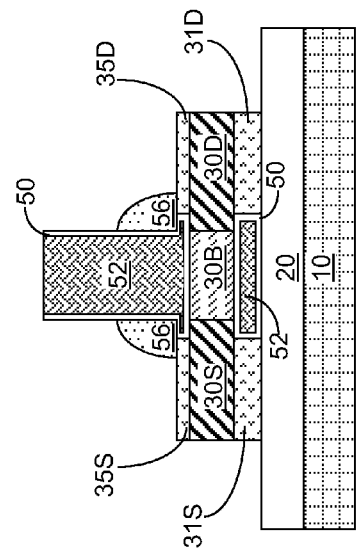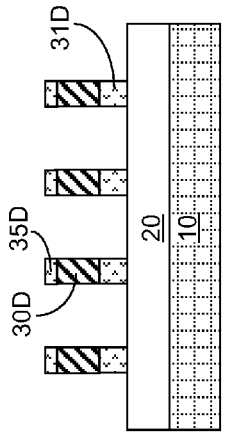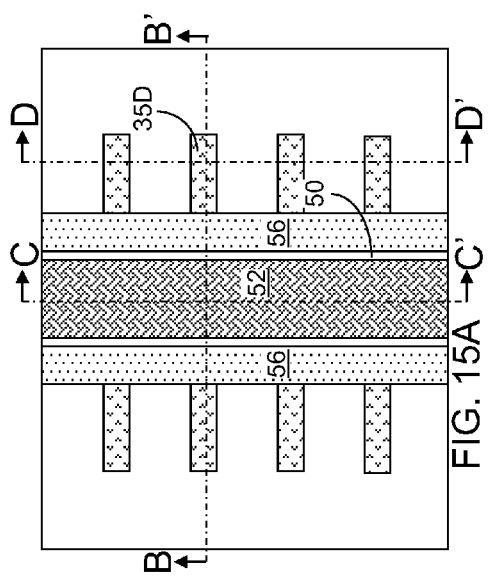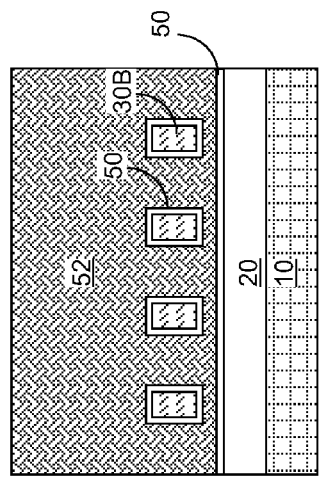

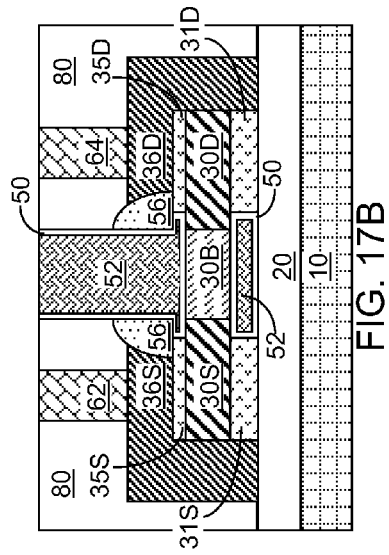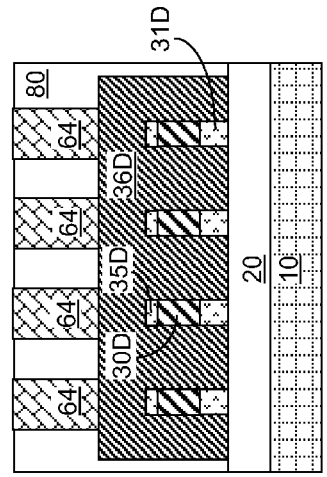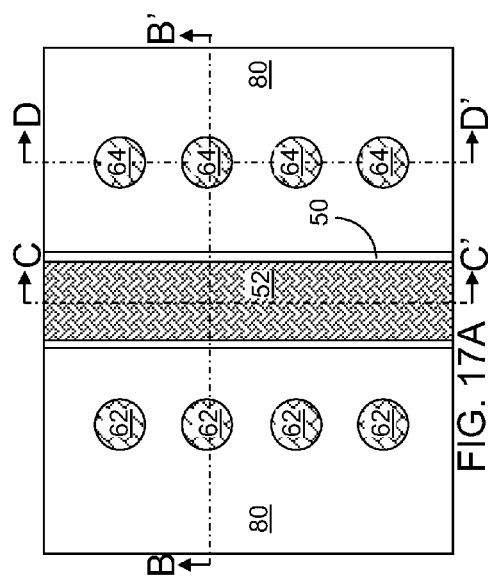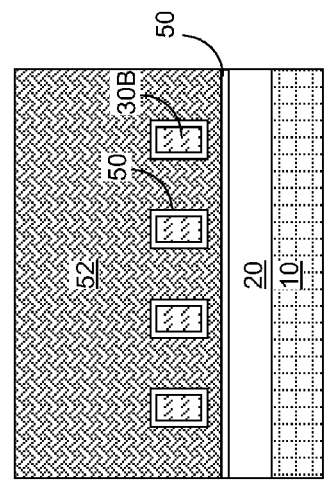

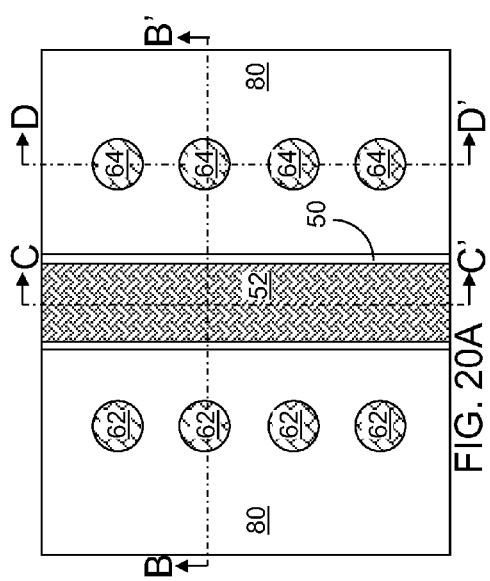
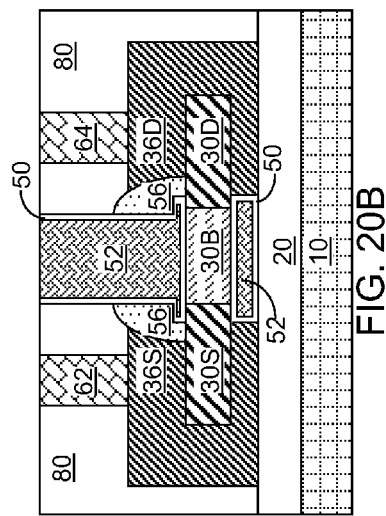
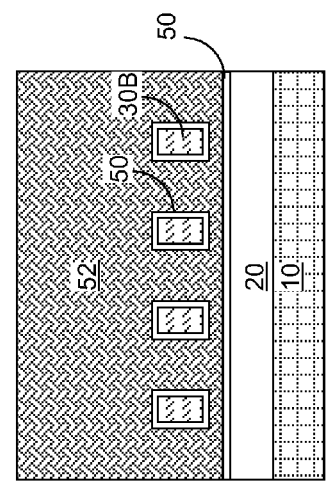
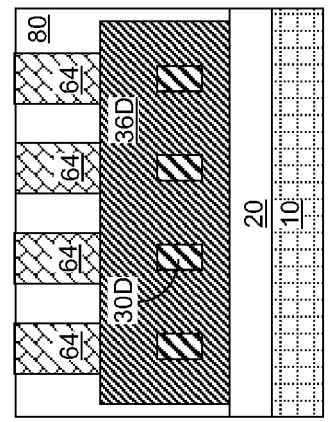

SUSPENDED BODY FIELD EFFECT TRANSISTOR

RELATED APPLICATIONS

The present application is related to copending U.S. patent application Ser. No. 14/010,585, the entire content of which is incorporated herein by reference.

BACKGROUND

The present disclosure relates to a semiconductor structure, and particularly to field effect transistors having a body region laterally surrounded by a gate electrode, and a method of manufacturing the same.

As field effect transistors are scaled down, the short channel effect and the increase in the extension resistance that accompany the scaling adversely impact performance of the field effect transistors. These problems are especially difficult to solve in fin field effect transistors employing a compound semiconductor material owing to the difficulty of forming high quality contacts and a severer constraint on thermal budget of processing relative to field effect transistors employing elemental semiconductor materials.

SUMMARY

A semiconductor fin including a vertical stack, from bottom to top, of a second semiconductor material and a first semiconductor material is formed on a substrate. A disposable gate structure straddling the semiconductor fin is formed. A source region and a drain region are formed employing the disposable gate structure as an implantation mask. At least one semiconductor shell layer or a semiconductor cap layer can be formed above the semiconductor fin. A planarization dielectric layer is formed such that a top surface of the planarization dielectric layer is coplanar with the disposable gate structure. A gate cavity is formed by removing the disposable gate structure and physically exposed portions of the at least one semiconductor shell layer or the semiconductor cap layer. A portion of the second semiconductor material is removed selective to the first semiconductor material within the gate cavity so that a middle portion of the semiconductor fin becomes suspended over the substrate. A gate dielectric layer and a gate electrode are sequentially formed to fill the gate cavity. The gate electrode laterally surrounds a body region of a fin field effect transistor.

According to an aspect of the present disclosure, a semiconductor structure includes a semiconductor fin, a first buffer semiconductor portion, a second buffer semiconductor portion, a gate dielectric layer, and a gate electrode. The semiconductor fin includes a semiconductor material and is located over a substrate. The semiconductor fin includes a source region, drain region, and a body region laterally contacting the source region and the drain region. The first buffer semiconductor portion is in contact with a first portion of a top surface of the substrate and a bottom surface of the source region. The second buffer semiconductor portion is in contact with a second portion of the top surface of the substrate and a bottom surface of the drain region. The gate dielectric layer and the gate electrode laterally surround the body region.

According to another aspect of the present disclosure, a method of forming a semiconductor structure is provided. A vertical stack is formed on a substrate. The vertical stack includes, from bottom to top, a buffer semiconductor portion and a semiconductor fin. The buffer semiconductor portion includes a buffer semiconductor material and the semiconductor fin includes a semiconductor material different from the buffer semiconductor material. A disposable gate structure straddling the vertical stack is formed. A planarization dielectric layer is formed over the vertical stack. A top surface of the planarization dielectric layer is coplanar with a top surface of the disposable gate structure. A gate cavity is formed by removing the disposable gate structure. The gate cavity is laterally extended by removing a physically exposed portion of the buffer semiconductor portion. A region of the semiconductor fin becomes suspended within the gate cavity. A gate dielectric layer and a gate electrode are formed within the gate cavity.

BRIEF DESCRIPTION OF SEVERAL VIEWS OF THE DRAWINGS

FIG. 5A is a top-down view of the first exemplary semiconductor structure after removal of physically exposed portions of the at least one semiconductor shell layer according to the first embodiment of the present disclosure.

FIG. 5B is a vertical cross-sectional view of the first exemplary semiconductor structure along the vertical plane B-B' of FIG. 5A.

FIG. 5C is a vertical cross-sectional view of the first exemplary semiconductor structure along the vertical plane C-C' of FIG. 5A.

FIG. 5D is a vertical cross-sectional view of the first exemplary semiconductor structure along the vertical plane D-D' of FIG. 5A.

FIG. 8A is a top-down view of a second exemplary semiconductor structure after formation of stacks of a buffer semiconductor portion, a semiconductor fin, and a cap semiconductor portion according to the second embodiment of the present disclosure.

FIG. 8B is a vertical cross-sectional view of the second exemplary semiconductor structure along the vertical plane B-B' of FIG. 8A.

FIG. 8C is a vertical cross-sectional view of the second exemplary semiconductor structure along the vertical plane C-C' of FIG. 8A.

FIG. 8D is a vertical cross-sectional view of the second exemplary semiconductor structure along the vertical plane D-D' of FIG. 8A.

FIG. 12A is a top-down view of a second exemplary semiconductor structure after formation of a gate dielectric layer and a gate electrode according to a second embodiment of the present disclosure.

FIG. 12B is a vertical cross-sectional view of the second exemplary semiconductor structure along the vertical plane B-B' of FIG. 12A.

FIG. 12C is a vertical cross-sectional view of the second exemplary semiconductor structure along the vertical plane C-C' of FIG. 12A.

FIG. 12D is a vertical cross-sectional view of the second exemplary semiconductor structure along the vertical plane D-D' of FIG. 12A.

FIG. 15A is a top-down view of the third exemplary semiconductor structure after formation of gate spacers according to the third embodiment of the present disclosure.

FIG. 15B is a vertical cross-sectional view of the third exemplary semiconductor structure along the vertical plane B-B' of FIG. 15A.

FIG. 15C is a vertical cross-sectional view of the third exemplary semiconductor structure along the vertical plane C-C' of FIG. 15A.

FIG. 15D is a vertical cross-sectional view of the third exemplary semiconductor structure along the vertical plane D-D' of FIG. 15A.

FIG. 17A is a top-down view of the third exemplary semiconductor structure after formation of a contact level dielectric layer and various contact via structures according to the third embodiment of the present disclosure.

FIG. 17B is a vertical cross-sectional view of the third exemplary semiconductor structure along the vertical plane B-B' of FIG. 17A.

FIG. 17C is a vertical cross-sectional view of the third exemplary semiconductor structure along the vertical plane C-C' of FIG. 17A.

FIG. 17D is a vertical cross-sectional view of the third exemplary semiconductor structure along the vertical plane D-D' of FIG. 17A.

FIG. 20A is a top-down view of a third variation of the third exemplary semiconductor structure according to the third embodiment of the present disclosure.

FIG. 20B is a vertical cross-sectional view of the third exemplary semiconductor structure along the vertical plane B-B' of FIG. 20A.

FIG. 20C is a vertical cross-sectional view of the third exemplary semiconductor structure along the vertical plane C-C' of FIG. 20A.

FIG. 20D is a vertical cross-sectional view of the third exemplary semiconductor structure along the vertical plane D-D' of FIG. 20A.

DETAILED DESCRIPTION

Figure 1A:
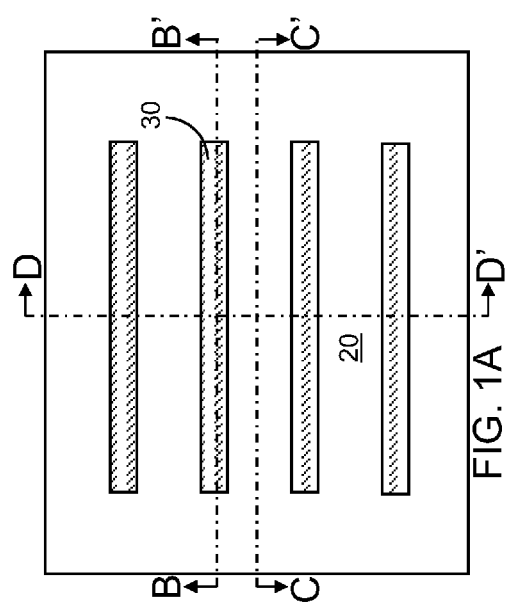
FIG. 1A is a top-down view of a first exemplary semiconductor structure after formation of a plurality of semiconductor fins including stacks of a buffer semiconductor portion and a semiconductor fin according to a first embodiment of the present disclosure.

As stated above, the present disclosure relates to field effect transistors having a body region laterally surrounded by a gate electrode, and a method of manufacturing the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Figure 1B:
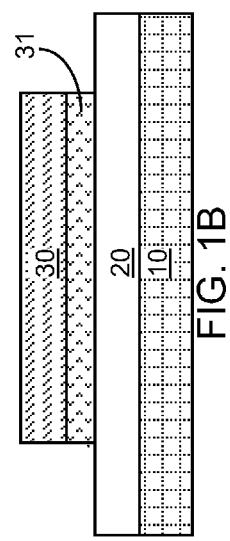
FIG. 1B is a vertical cross-sectional view of the first exemplary semiconductor structure along the vertical plane B-B' of FIG. 1A.
Figure 1C:
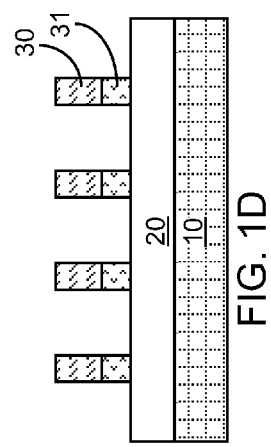
FIG. 1C is a vertical cross-sectional view of the first exemplary semiconductor structure along the vertical plane C-C' of FIG. 1A.
Figure 1D:
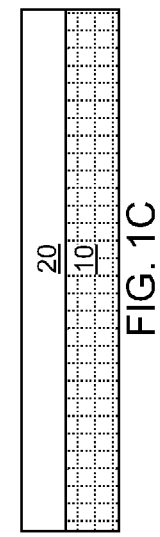
FIG. 1D is a vertical cross-sectional view of the first exemplary semiconductor structure along the vertical plane D-D' of FIG. 1A.

Referring to FIGS. 1A-1D, a first exemplary semiconductor structure according to a first embodiment of the present disclosure includes a plurality of semiconductor fins 30 formed on a substrate (10, 20). The plurality of semiconductor fins 30 can be formed, for example, by providing a substrate including a stack, from bottom to top, of a handle substrate 10, a buried insulator layer 20, and a vertical stack of a buffer semiconductor layer and a device semiconductor material layer. Each of the plurality of semiconductor fins 30 can have a uniform width throughout. For each semiconductor fin 30, a horizontal direction that is perpendicular to the direction of the uniform width of the semiconductor fins 30 is herein referred to as a "lengthwise" direction of the semiconductor fin 30. The device semiconductor material layer includes a first semiconductor material. The buffer semiconductor layer includes a second semiconductor material, which is also referred to as a buffer semiconductor material. The vertical stack of the buffer semiconductor layer and the device semiconductor material layer can be subsequently patterned to form the plurality of semiconductor fins 30 and buffer semiconductor portions 31. As used herein, a "semiconductor material" refers to a material that can have a resistivity less than $3 \times 10^3$ Ohm-cm upon suitable doping.

The handle substrate 10 can include a semiconductor material, a conductive material, and/or a dielectric material. The handle substrate 10 can provide mechanical support to the buried insulator layer 20, the buffer semiconductor portions 31, and the plurality of semiconductor fins 30. The thickness of the handle substrate 10 can be from 30 microns to 2 mm, although lesser and greater thicknesses can also be employed.

The insulator layer 20 includes an insulator material. As used herein, an insulator material refers to a material having a resistivity greater than $3 \times 10^3$ Ohm-cm. The insulator layer 20 can include a dielectric material such as silicon oxide, silicon nitride, silicon oxynitride, sapphire, or a combination thereof, or can include an intrinsic semiconductor material such as intrinsic InP or intrinsic Si, or a doped insulating semiconductor material such as doped insulating InP or doped insulating GaAs. The thickness of the buried insulator layer 20 can be from 50 nm to 5 microns, although lesser and greater thicknesses can also be employed. In one embodiment, the insulator layer 20 and the handle substrate 10 can be a single contiguous structure including a same insulator material, i.e., the handle substrate 10 and the insulator layer 20 can be merged into a single insulating layer including a same insulating material. The combination of the handle substrate 10 and the insulator layer 20 is herein referred to as a substrate (10, 20).

The buffer semiconductor layer includes a semiconductor material that can be removed selective to the first semiconductor material in an etch process. In one embodiment, the buffer semiconductor layer can include indium phosphide (InP) and the device semiconductor material layer can include indium gallium arsenide (InGaAs). The thickness of the buffer semiconductor layer can be in a range from 5 nm to 20 nm, although lesser and greater heights can be employed for the buffer semiconductor layer.

In one embodiment, the buffer semiconductor layer can be a single crystalline semiconductor material layer. In this case, the buffer semiconductor layer may, or may not, be epitaxially aligned to the insulator layer 20.

The device semiconductor material layer can include an elemental semiconductor material or a compound semiconductor material. In one embodiment, the first semiconductor material can be a III-V compound semiconductor material. The first semiconductor material may or may not be doped with p-type dopants and/or n-type dopants. The semiconductor material can be a single crystalline semiconductor material, a polycrystalline semiconductor material, or an amorphous semiconductor material. The thickness of the device semiconductor material layer can be from 10 nm to 500 nm, although lesser and greater thicknesses can also be employed. In one embodiment, the first semiconductor material can be a single-crystalline III-V compound semiconductor material. In one embodiment, the first semiconductor material can be single-crystalline InGaAs. In one embodiment, the device semiconductor material layer can be formed by epitaxial deposition of the first semiconductor material on the top surface of the buffer semiconductor layer. In this case, the first semiconductor material can be single crystalline, and can be epitaxially aligned to the single crystalline material of the buffer semiconductor layer.

The vertical stack of the buffer semiconductor layer and the device semiconductor material layer can be patterned, for example, by applying a photoresist layer thereupon, lithographically patterning the photoresist layer, and transferring the pattern in the photoresist layer into the vertical stack of the buffer semiconductor layer and the device semiconductor material layer by a directional etch such as a reactive ion etch. The photoresist layer is subsequently removed, for example, by ashing. Remaining portions of the device semiconductor material layer constitutes semiconductor fins 30, and remaining portions of the buffer semiconductor layer constitute buffer semiconductor portions 31.

Each semiconductor fin 30 can have a uniform width and a uniform height throughout the entirety thereof. Each buffer semiconductor portion 31 can have the same width as the overlying semiconductor fin 30 throughout the entirety of the buffer semiconductor portion 31. Each buffer semiconductor portion 31 can have the same height throughout the entirety thereof.

As used herein, a "semiconductor fin" refers to a contiguous structure including at least one semiconductor material and including a pair of substantially vertical sidewalls that are parallel to each other. As used herein, a surface is "substantially vertical" if there exists a vertical plane from which the surface does not deviate by more than three times the root mean square roughness of the surface. In one embodiment, each semiconductor fin 30 can laterally extend along a lengthwise direction. As used herein, a lengthwise direction of a structure refers to the direction along which the moment of inertia of the structure becomes a minimum.

While the present disclosure is illustrated with a plurality of semiconductor fins 30, embodiments in which a single semiconductor fin 30 is employed in lieu of a plurality of semiconductor fins 30 are expressly contemplated herein.

Figure 2B:
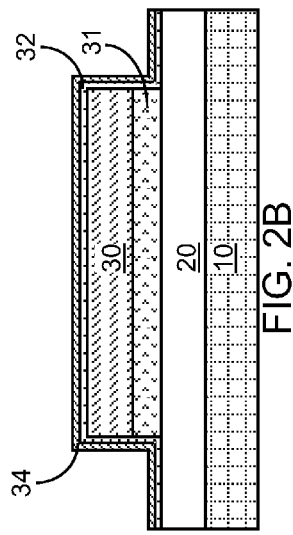
FIG. 2B is a vertical cross-sectional view of the first exemplary semiconductor structure along the vertical plane B-B' of FIG. 2A.
Figure 2C:
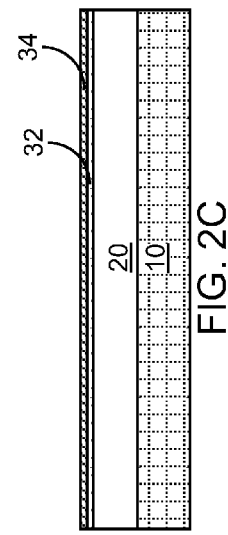
FIG. 2C is a vertical cross-sectional view of the first exemplary semiconductor structure along the vertical plane C-C' of FIG. 2A.
Figure 2A:
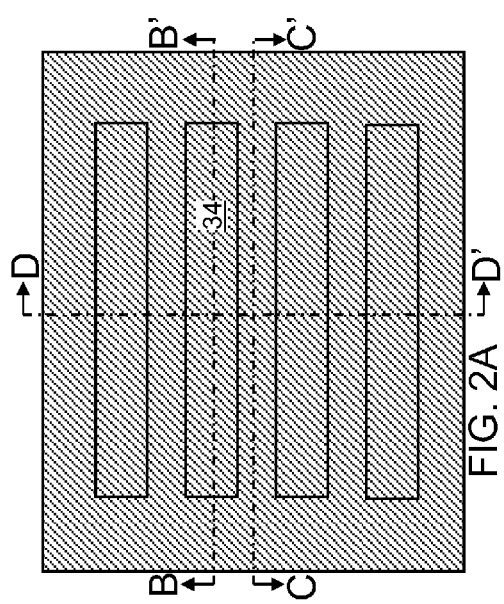
FIG. 2A is a top-down view of the first exemplary semiconductor structure after formation of at least one semiconductor shell layer according to the first embodiment of the present disclosure.
Figure 2D:
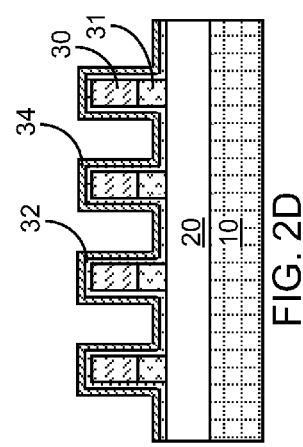
FIG. 2D is a vertical cross-sectional view of the first exemplary semiconductor structure along the vertical plane D-D' of FIG. 2A.

Referring to FIGS. 2A-2D, at least one semiconductor shell layer (32, 34) is deposited on the physically exposed surfaces of the plurality of semiconductor fins 30 and the buffer semiconductor portions 31. As used herein, a "shell layer" layer refers to a layer that envelops a structure such that there exists a line connecting two points within the layer and passing through the structure. For example, a line connecting a point within a first portion of the at least one semiconductor shell layer (32, 34) that contacts a first sidewall of a semiconductor fin 30 and another point within a second portion of the at least one semiconductor shell layer (32, 34) that contacts a second sidewall of the semiconductor fin 30 can pass through the semiconductor fin 30.

The at least one semiconductor shell layer (32, 34) can be deposited, for example, by chemical vapor deposition. In one embodiment, the at least one semiconductor shell layer (32, 34) can be deposited by an epitaxial deposition process so that portions of the at least one semiconductor shell layer (32, 34) that are deposited on single crystalline surfaces are deposited as single crystalline semiconductor materials in epitaxial alignment with the underlying single crystalline structure. In one embodiment, the portions of the at least one semiconductor shell layer (32, 34) that are deposited on the plurality of semiconductor fins 30 and the buffer semiconductor portions 31 can be single crystalline.

Each semiconductor shell layer within the at least one semiconductor shell layer (32, 34) includes a semiconductor material, and can be single crystalline. In one embodiment, the at least one semiconductor shell layer (32, 34) can include a first semiconductor shell layer 32 and a second semiconductor shell layer 34. The first semiconductor shell layer 32 can be deposited directly on sidewalls surfaces of each semiconductor fin 30 and each buffer semiconductor portion 31. The second semiconductor shell layer 34 can be deposited directly on surfaces of the first semiconductor shell layer 32.

Figure 7A:
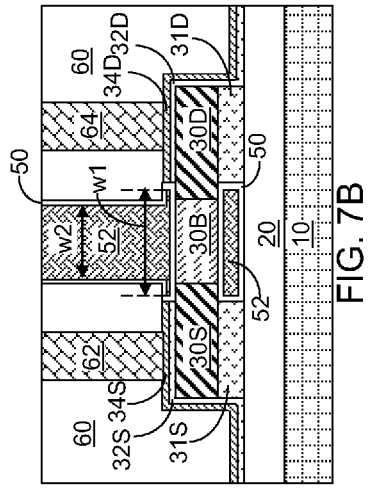
FIG. 7A is a top-down view of the first exemplary semiconductor structure after formation of contact via structures according to the first embodiment of the present disclosure.
Figure 7B:
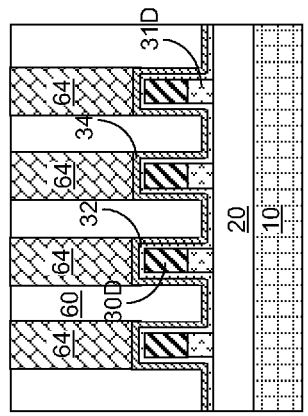
FIG. 7B is a vertical cross-sectional view of the first exemplary semiconductor structure along the vertical plane B-B' of FIG. 7A.
Figure 7C:
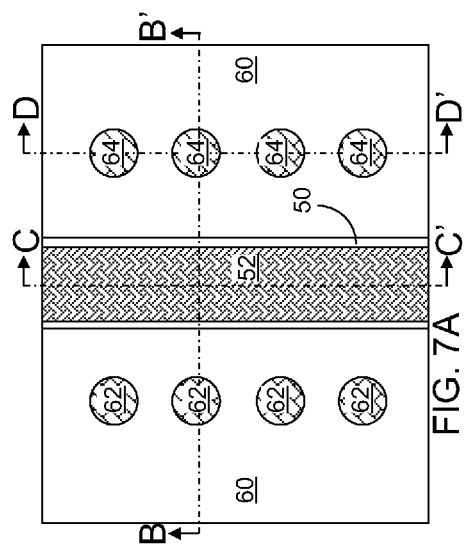
FIG. 7C is a vertical cross-sectional view of the first exemplary semiconductor structure along the vertical plane C-C' of FIG. 7A.
Figure 7D:
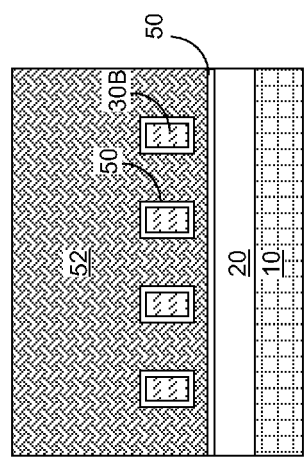
FIG. 7D is a vertical cross-sectional view of the first exemplary semiconductor structure along the vertical plane D-D' of FIG. 7A.

The semiconductor material of the first semiconductor shell layer 32 is herein referred to as a third semiconductor material. The semiconductor material of the second semiconductor shell layer 34 is herein referred to as a fourth semiconductor material. The third semiconductor material can be selected from a material that can be etched selective to the first semiconductor material. The fourth semiconductor material can be selected such that the contact resistance between the fourth semiconductor material and a metallic material to be employed in contact via structures (62, 64; See FIGS. 7A-7D) is less than the contact resistance between the third semiconductor material and the metallic material. In one embodiment, the third semiconductor material can be n-doped InP, and the fourth semiconductor material can be n-doped InGaAs.

In one embodiment, the first semiconductor shell layer 32 can include a semiconductor material that can be removed selective to the semiconductor material of the semiconductor fins 30. In one embodiment, the first semiconductor shell layer 32 can include the same semiconductor material as the buffer semiconductor portions 31. In one embodiment, the buffer semiconductor portions 31 and the first semiconductor shell layer 32 can include n-doped InP, and the semiconductor fins 30 can include intrinsic or p-doped InGaAs. The thickness of the first semiconductor shell layer 32 can be in a range from 1 nm to 10 nm, although lesser and greater thicknesses can also be employed.

In one embodiment, the second semiconductor shell layer 34 can include a semiconductor material having a greater conductivity than the first semiconductor material of the semiconductor fins 30 as provided upon formation of the vertical stacks of semiconductor fins 30 and buffer semiconductor portions 31. In one embodiment, the buffer semiconductor portions 31 and the first semiconductor shell layer 32 can include n-doped InP, the semiconductor fins 30 can include intrinsic or p-doped InGaAs, and the second semiconductor shell layer 34 can include n-doped InGaAs. The thickness of the second semiconductor shell layer 34 can be in a range from 1 nm to 10 nm, although lesser and greater thicknesses can also be employed.

Figure 3A:
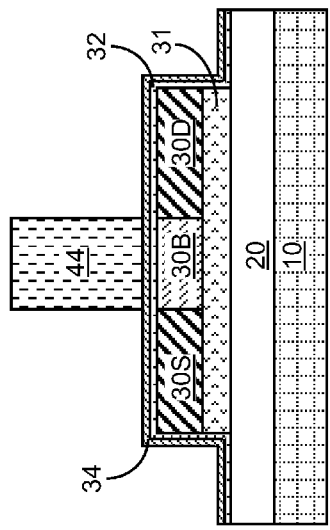
FIG. 3A is a top-down view of the first exemplary semiconductor structure after formation of a disposable gate structure according to the first embodiment of the present disclosure.
Figure 3B:
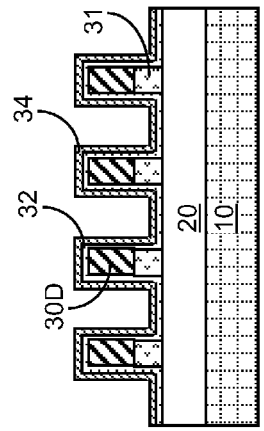
FIG. 3B is a vertical cross-sectional view of the first exemplary semiconductor structure along the vertical plane B-B' of FIG. 3A.
Figure 3C:
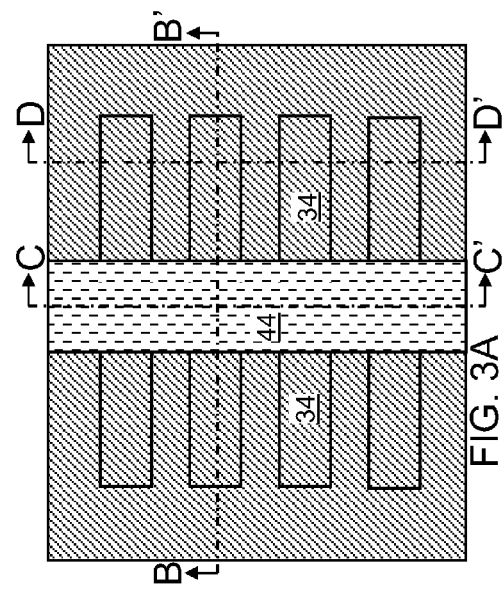
FIG. 3C is a vertical cross-sectional view of the first exemplary semiconductor structure along the vertical plane C-C' of FIG. 3A.
Figure 3D:
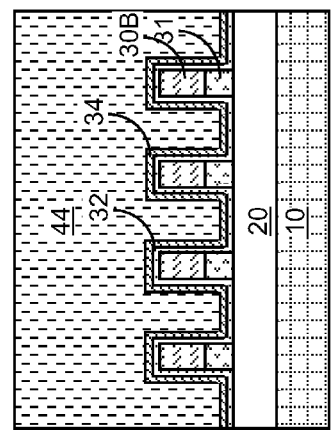
FIG. 3D is a vertical cross-sectional view of the first exemplary semiconductor structure along the vertical plane D-D' of FIG. 3A.

Referring to FIGS. 3A-3D, a disposable gate structure 44 straddling the plurality of semiconductor fins 30 can be formed. The disposable gate structure 44 can be formed, for example, by depositing a disposable gate material layer and patterning the disposable gate material layer using lithography and anisotropic etch. A remaining portion of the disposable gate material layer after the lithographic patterning constitutes the disposable gate structure 44.

The disposable gate material layer includes at least one material that can be removed selective to the second semiconductor shell layer 34. In this case, the disposable gate material layer can include a dielectric material, a semiconductor material, and/or a metallic material. For example, the disposable gate material layer, and consequently, the disposable gate structure 44, can include germanium, a silicon germanium alloy, silicon nitride, silicon oxynitride, organosilicate glass, an elemental metal, an intermetallic alloy, a metallic nitride, a metallic carbide, or combinations thereof. The disposable gate material layer can be deposited, for example, by chemical vapor deposition (CVD). The height of the disposable gate structure 44, as measured above a topmost surface of the at least one semiconductor shell layer (32, 34), can be from 50 nm to 600 nm, although lesser and greater thicknesses can also be employed. The disposable gate material layer is subsequently patterned to form the disposable gate structure 44. The patterning of the disposable gate material layer can be performed, for example, by applying and lithographically patterning a photoresist layer over the disposable gate material layer, transferring the pattern in the photoresist layer into the disposable gate material layer by an anisotropic etch, and removing the patterned photoresist layer, for example, by ashing.

Dopant atoms can be implanted into the plurality of semiconductor fins 30 employing the disposable gate structure 44 as an implantation mask. P-type dopants or n-type dopants can be introduced into portions of the plurality of semiconductor fins 30 that are not covered by the disposable gate structure 44. The implanted portions of semiconductor fins 30 constitute source regions 30S and drain regions 30D. The unimplanted portions of the semiconductor fins 30 constitute body regions 30B of a field effect transistor to be subsequently formed.

In one embodiment, the body regions 30B can have a doping of a first conductivity type, and the implanted dopants can have a doping of a second conductivity type that is the opposite of the first conductivity type. For example, the first conductivity type can be p-type and the second conductivity type can be n-type, or vice versa. In this case, the source regions 30S and the drain regions 30D can have a doping of the second conductivity type. The disposable gate structure 44 functions as a self-aligned implantation mask for the purpose of the ion implantation process. Each semiconductor fin (30S, 30D, 30B) includes the first semiconductor material, and as such, each semiconductor fin (30S, 30D, 30B) is a first semiconductor fin, i.e., a region including a first semiconductor material. In one embodiment, the dopant atoms can be n-type dopant atoms, and the source regions 30S and the drain regions 30D can be n-doped semiconductor material regions.

Figure 4A:
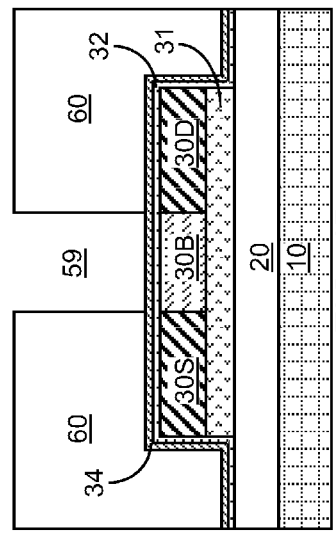
FIG. 4A is a top-down view of the first exemplary semiconductor structure after formation of a planarization dielectric layer and subsequent removal of the disposable gate structure to form a gate cavity according to the first embodiment of the present disclosure.
Figure 4B:
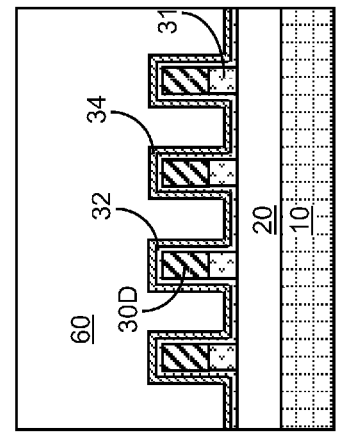
FIG. 4B is a vertical cross-sectional view of the first exemplary semiconductor structure along the vertical plane B-B' of FIG. 4A.
Figure 4C:
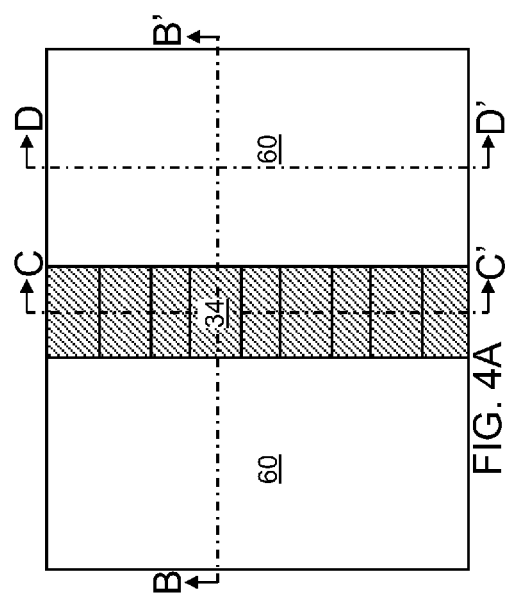
FIG. 4C is a vertical cross-sectional view of the first exemplary semiconductor structure along the vertical plane C-C' of FIG. 4A.
Figure 4D:
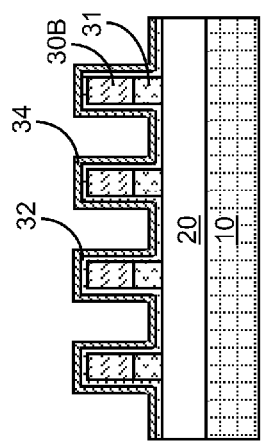
FIG. 4D is a vertical cross-sectional view of the first exemplary semiconductor structure along the vertical plane D-D' of FIG. 4A.

Referring to FIGS. 4A-4D, a planarization dielectric layer 60 is deposited over the at least one semiconductor shell layer (32, 34) and the disposable gate structure 44. The planarization dielectric layer 60 includes a dielectric material such as silicon oxide, silicon nitride, silicon oxynitride, organosilicate glass, or combinations thereof. The planarization dielectric layer 60 includes a different material than the material of the disposable gate structure 44. The planarization dielectric layer 60 is subsequently planarized to a height at which a top surface of the disposable gate structure 44 becomes physically exposed. The planarization of the planarization dielectric layer 60 can be performed, for example, by chemical mechanical planarization (CMP). In one embodiment, the disposable gate structure 44 can be employed as a stopping structure for the planarization process. After the planarization process, the top surface of the planarization dielectric layer 60 can be coplanar with a top surface of the disposable gate structure 44. As used herein, a first surface is coplanar with a second surface if a two-dimensional Euclidean plane exists that coincide with the first surface and the second surface.

Subsequently, the disposable gate structure 44 is removed selective to the material of the planarization dielectric layer 60. In one embodiment, the disposable gate structure 44 can be removed selective to at least one of the material of the second semiconductor shell layer 34 and the semiconductor fin (30S, 30D, 30B). As used herein, a removal process that removes a first material is "selective" to a second material if the removal process does not remove the second material at a removal rate greater than 1% of the removal rate of the first material. The cavity that is formed by removal of the disposable gate structure 44 is herein referred to as a gate cavity 59. After the removal of the disposable gate structure 44, top surfaces and sidewall surfaces are physically exposed for one of the second semiconductor shell layer 34 and the semiconductor fin (30S, 30D, 30B). In one embodiment, top surfaces and sidewall surfaces of the second semiconductor shell layer 34 can be physically exposed after formation of the gate cavity 59. In another embodiment, top surfaces and sidewall surfaces of the first semiconductor shell layer 32 can be physically exposed after formation of the gate cavity 59 by performing an additional etching to remove physically exposed portions of the second semiconductor shell layer 34 within the gate cavity 59. In yet another embodiment, top surfaces and sidewall surfaces of the semiconductor fin (30S, 30D, 30B) can be physically exposed after formation of the gate cavity 59 by performing an additional etching to remove physically exposed portions of the first semiconductor shell layer 32 within the gate cavity 59.

Referring to FIGS. 5A-5D, physically exposed portion of the at least one semiconductor shell layer (32, 34) can be removed within the gate cavity 59 either during the etch process that removes the disposable gate structure 44 or after removal of the disposable gate structure 44. For example, after removal of the disposable gate structure 44, any physically exposed portions of the second semiconductor shell layer 34 within the gate cavity 59, if present, are removed by an isotropic etch that is selective to the planarization dielectric layer 60. The remaining portions of the second semiconductor shell layer 34 become disjoined into two distinct portions, which include a second source-side semiconductor shell layer 34S that envelops the source regions 30S, and a second drain-side semiconductor shell layer 34D that envelops the drain regions 30D.

Any physically exposed portions of the first semiconductor shell layer 32 within the gate cavity 59, if present, are removed by another isotropic etch that is selective to the planarization dielectric layer 60. The remaining portions of the first semiconductor shell layer 32 become disjoined into two distinct portions, which include a first source-side semiconductor shell layer 32S that contact the source regions 30S, and a first drain-side semiconductor shell layer 32D that contact the drain regions 30D.

The first source-side semiconductor shell layer 32S and the second source-side semiconductor shell layer 34S are collectively referred to as at least one source-side semiconductor shell layers (32S, 34S). The first drain-side semiconductor shell layers 32D and the second drain-side semiconductor shell layers 34D are collectively referred to as at least one drain-side semiconductor shell layers (32D, 34D).

Once sidewalls of the body regions 30B of the plurality of semiconductor fins (30S, 30D, 30B) and the sidewalls of the buffer semiconductor portions 31 are physically exposed within the gate cavity 59, a physically exposed portion of each buffer semiconductor portion 31 is removed by an isotropic etch that is selective to the plurality of semiconductor fins (30S, 30D, 30B) and the dielectric material of the planarization dielectric layer 60. The isotropic etch can be a wet etch or a dry etch. The gate cavity 59 is laterally expanded by the isotropic etch, and a physically exposed portion of each semiconductor fin (30S, 30D, 30B) becomes suspended within the gate cavity 59. Remaining portions of the buffer semiconductor material portions 31 are herein referred to as first buffer semiconductor material portions 31S and second buffer semiconductor material portions 31D. Each first buffer semiconductor portion 31S is in contact with a first portion of the top surface of the substrate (10, 20) and a bottom surface of a source region 30S. Each second buffer semiconductor portion 31D is in contact with a second portion of the top surface of the substrate (10, 20) and a bottom surface of a drain region 30D.

Figure 6A:
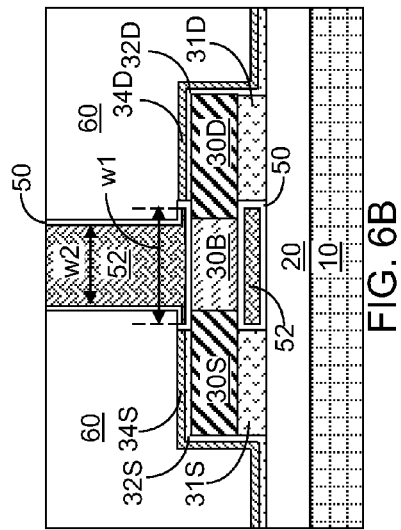
FIG. 6A is a top-down view of the first exemplary semiconductor structure after formation of a gate dielectric layer and a gate electrode according to the first embodiment of the present disclosure.
Figure 6B:
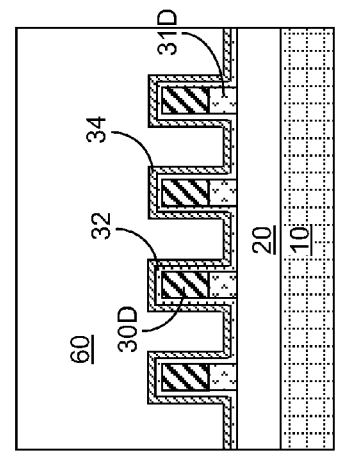
FIG. 6B is a vertical cross-sectional view of the first exemplary semiconductor structure along the vertical plane B-B' of FIG. 6A.
Figure 6C:
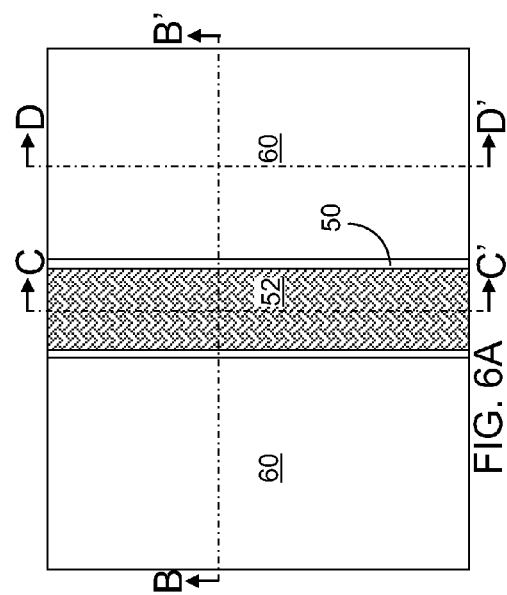
FIG. 6C is a vertical cross-sectional view of the first exemplary semiconductor structure along the vertical plane C-C' of FIG. 6A.
Figure 6D:
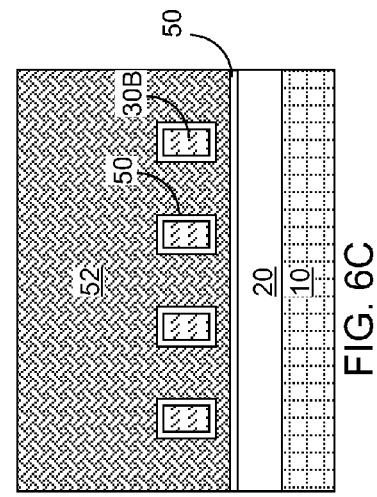
FIG. 6D is a vertical cross-sectional view of the first exemplary semiconductor structure along the vertical plane D-D' of FIG. 6A.

Referring to FIGS. 6A-6D, a gate dielectric layer 50 and a gate electrode 52 are formed within the gate cavity 59. The gate dielectric layer 50 is formed directly on sidewalls surfaces of remaining portions of the first and second semiconductor shell layers (32, 34), i.e., the at least one source-side semiconductor shell layer (32S, 34S) and the at least one drain-side semiconductor shell layer (32D, 34D). The gate dielectric layer 50 includes a dielectric material such as silicon oxide, silicon nitride, silicon oxynitride, or a dielectric metal compound, i.e., a dielectric material including a metal-containing compound. In one embodiment, the gate dielectric layer 50 includes a dielectric metal oxide or a dielectric metal oxynitride such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. In one embodiment, the dielectric metal oxide or a dielectric metal oxynitride can have a dielectric constant greater than 8.0. The thickness of the gate dielectric layer 50 can be from 0.6 nm to 10 nm, although lesser and greater thicknesses can also be employed. In one embodiment, the gate dielectric layer 50 can be deposited by methods such as chemical vapor deposition (CVD), physical vapor deposition (PVD), molecular beam deposition (MBD), pulsed laser deposition (PLD), liquid source misted chemical deposition (LSMCD), atomic layer deposition (ALD), etc. In one embodiment, the gate dielectric layer 50 can be formed as a conformal material layer having a uniform thickness throughout.

The gate electrode 52 can be formed by depositing a conductive material on top of the dielectric material layer 50 to fill the gate cavity 59. Excess portions of the conductive material can be removed from above the top surface of the planarization dielectric layer 60, for example, by chemical mechanical planarization. A remaining portion of the deposited conductive material constitutes the gate electrode 52. Portions of the gate dielectric layer 50 overlying the top surface of the planarization dielectric layer 60 may be removed during the planarization process. The top surface of the gate electrode 52 can be coplanar with the top surface of the remaining portions of the planarization dielectric layer 60. The gate electrode 52 laterally surrounds the suspended portion of each semiconductor fin (30S, 30D, 30B). Thus, the gate electrode laterally surrounds each body region 30B.

The first exemplary semiconductor structure contains at least one semiconductor fin (30S, 30D, 30B). Each semiconductor fin (30S, 30D, 30B) includes a first semiconductor material, and is located over a substrate (10, 20). Each semiconductor fin (30S, 30D, 30B) includes a source region 30S, drain region 30D, and a body region 30B laterally contacting the source region 30S and the drain region 30D. The first exemplary semiconductor structure further includes at least one first buffer semiconductor portion 31S and at least one second buffer semiconductor portion 31D. Each first buffer semiconductor portion 31S is in contact with a first portion of the top surface of the substrate (10, 20) and a bottom surface of a source region 30S. Each second buffer semiconductor portion 31D is in contact with a second portion of the top surface of the substrate (10, 20) and a bottom surface of a drain region 30D. A gate dielectric layer 50 and a gate electrode 52 surrounding each body region 30B.

For each body region 30B, a portion of the gate electrode 52 underlies the body region 30B. In one embodiment, the gate dielectric layer 50 can contact sidewalls of the first buffer semiconductor portions 31S and the second buffer semiconductor portions 31D.

In one embodiment, the sidewalls of the at least one source-side semiconductor shell layers (32S, 34S) can be laterally recessed relative to a sidewall of the planarization dielectric layer 60 within the gate cavity, and the sidewalls of the at least one drain-side semiconductor shell layers (32D, 34D) can be laterally recessed relative to another sidewall of the planarization dielectric layer 60 within the gate cavity. In this case, a first gate electrode portion can laterally surrounding the body regions 30B and have a first width w1, and a second gate electrode portion can overlie the body regions 30B and have a second width w2 such that the first width w1 is greater than the second width w2.

In one embodiment, each semiconductor fin (30S, 30D, 30S) can extend along a lengthwise direction. A first end wall of each semiconductor fin (30S, 30D, 30B), i.e., an end wall of a source region 30S, and an end wall of the underlying first buffer semiconductor portion 31S can be within a same vertical plane, which is herein referred to as a first vertical plane. A second end wall of each semiconductor fin (30S, 30D, 30B), i.e., an end wall of a drain region 30D, and an end wall of the underlying second buffer semiconductor portion 31D can be within a same vertical plane, which is herein referred to as a second vertical plane.

In one embodiment, the first semiconductor material of the plurality of semiconductor fins (30S, 30D, 30B) can be single crystalline, the first buffer semiconductor portions 31S and the second buffer semiconductor portions 31D can include a second semiconductor material that is single crystalline. The first semiconductor material can be epitaxially aligned to the second semiconductor material in the first buffer semiconductor portions 31S and the second buffer semiconductor portions 31D. In one embodiment, the first semiconductor material can be a first III-V compound semiconductor material and the second semiconductor material can be a second III-V compound semiconductor material.

The first exemplary semiconductor structure further includes at least one source-side semiconductor shell layer (32S, 34S) contacting a top surface and sidewalls of each source regions 30S. Specifically, the first source-side semiconductor shell layer 32S contacts the top surface and sidewalls of each source region 30S. Further, the first exemplary semiconductor structure further includes at least one drain-side semiconductor shell layer (32D, 34D) contacting a top surface and sidewalls of each drain regions 30D. Specifically, the first drain-side semiconductor shell layer 32D contacts the top surface and sidewalls of each drain region 30D.

Referring to FIGS. 7A-7D, various contact via structures (62, 64) can be formed through the planarization dielectric layer 60. The various contact via structures (62, 64) extend through the planarization dielectric layer 60, and contact the source regions 30S or the drain regions 30D. It is noted that one or more of the various contact via structures (62, 64) may be a continuous contact bar. Further, one or more of the various contact via structures (62, 64) may physically contact sidewalls of at least one semiconductor fin (30S, 30D, 30B).

Referring to FIGS. 8A-8D, a second exemplary semiconductor structure according to the second embodiment of the present disclosure can be formed, for example, by providing a stack of a substrate (10, 20), a buffer semiconductor layer, and a device semiconductor material layer in the same manner as in the first embodiment. Subsequently, a cap semiconductor layer is formed on the top surface of the device semiconductor material layer. The cap semiconductor layer includes a semiconductor material that is different from the first semiconductor material, i.e., the semiconductor material of the device semiconductor material layer. In one embodiment, the cap semiconductor layer can have the same material as the buffer semiconductor layer. In one embodiment, the buffer semiconductor layer and the cap semiconductor layer can include n-doped InP. The thickness of the cap semiconductor layer can be in a range from 1 nm to 20 nm, although lesser and greater thicknesses can also be employed.

The stack of the cap semiconductor layer, the device semiconductor material layer, and the buffer semiconductor layer are patterned by a combination of lithographic methods and at least one anisotropic etch to form stacks of a buffer semiconductor portion 31, a semiconductor fin 30, and a cap semiconductor portion 35. Each cap semiconductor portion 35 is in contact with a top surface of a semiconductor fin 30, and each buffer semiconductor portion 31 is in contact with a bottom surface of a semiconductor fin 30.

Figure 9B:
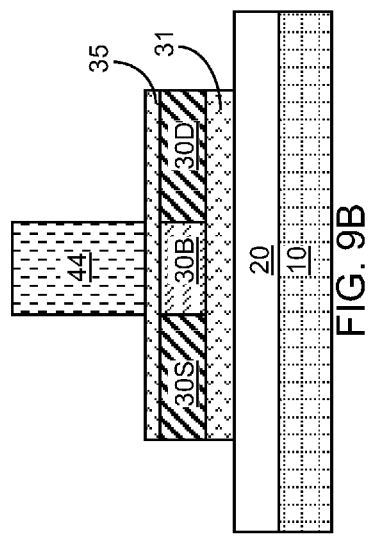
FIG. 9B is a vertical cross-sectional view of the second exemplary semiconductor structure along the vertical plane B-B' of FIG. 9A.
Figure 9A:
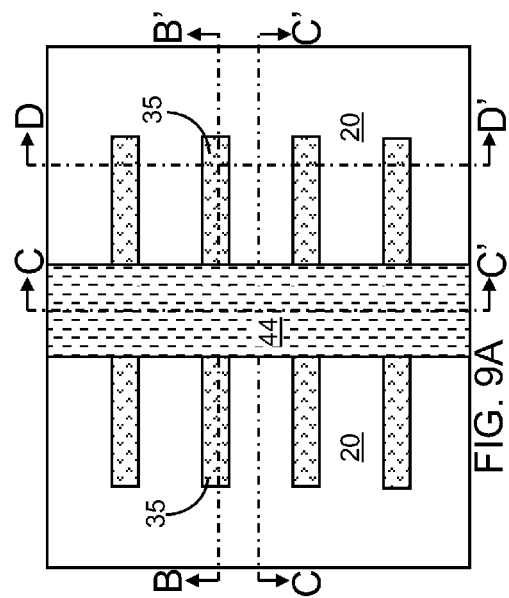
FIG. 9A is a top-down view of the second exemplary semiconductor structure after formation of a disposable gate structure according to the second embodiment of the present disclosure.
Figure 9D:
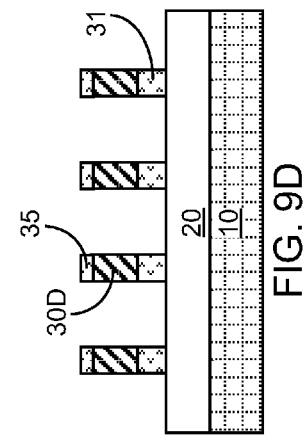
FIG. 9D is a vertical cross-sectional view of the second exemplary semiconductor structure along the vertical plane D-D' of FIG. 9A.
Figure 9C:
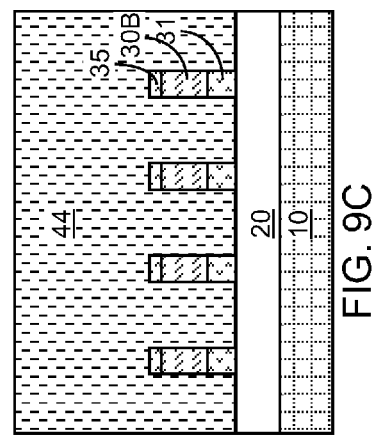
FIG. 9C is a vertical cross-sectional view of the second exemplary semiconductor structure along the vertical plane C-C' of FIG. 9A.

Referring to FIGS. 9A-9D, a disposable gate structure 44, source regions 30S, drain regions 30D, and body regions 30B are formed, for example, by performing the processing steps illustrated in FIGS. 3A-3D.

Figure 10B:
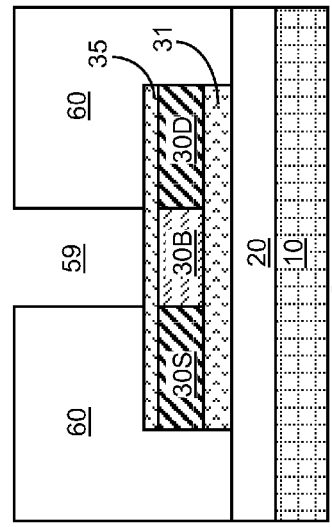
FIG. 10B is a vertical cross-sectional view of the second exemplary semiconductor structure along the vertical plane B-B' of FIG. 10A.
Figure 10D:
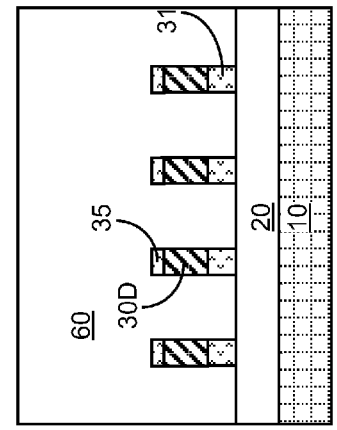
FIG. 10D is a vertical cross-sectional view of the second exemplary semiconductor structure along the vertical plane D-D' of FIG. 10A.
Figure 10A:
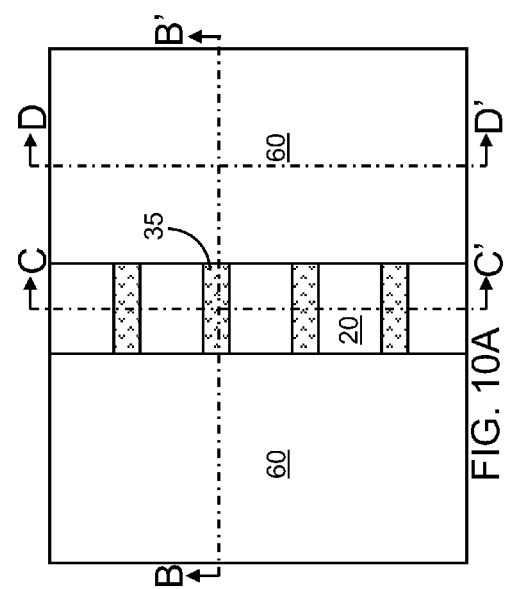
FIG. 10A is a top-down view of the second exemplary semiconductor structure after formation of a planarization dielectric layer and formation of a gate cavity according to the second embodiment of the present disclosure.
Figure 10C:
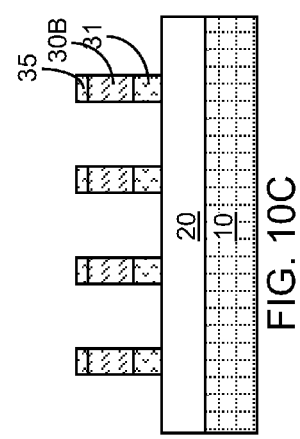
FIG. 10C is a vertical cross-sectional view of the second exemplary semiconductor structure along the vertical plane C-C' of FIG. 10A.

Referring to FIGS. 10A-10D, a planarization dielectric layer 60 is formed and the disposable gate structure 44 is removed, for example, by performing the processing steps illustrated in FIGS. 4A-4D. A top surface of each cap semiconductor portion 35, sidewall surfaces of each cap semiconductor portion 35, and sidewall surfaces of each buffer semiconductor portion 31 are physically exposed in the gate cavity 59.

Figure 11B:
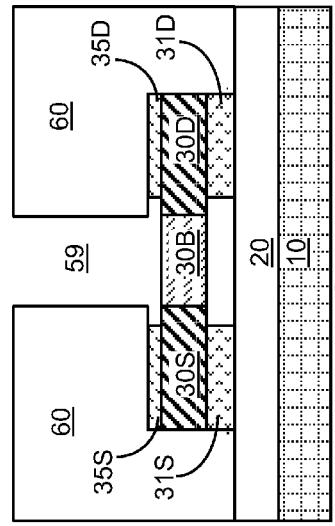
FIG. 11B is a vertical cross-sectional view of the second exemplary semiconductor structure along the vertical plane B-B' of FIG. 11A.
Figure 11D:
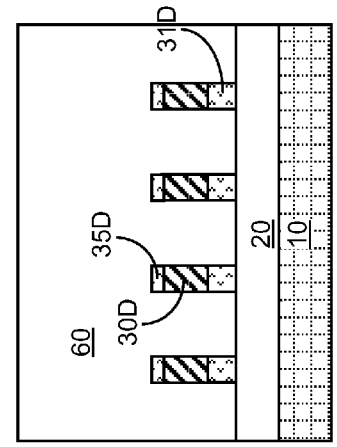
FIG. 11D is a vertical cross-sectional view of the second exemplary semiconductor structure along the vertical plane D-D' of FIG. 11A.
Figure 11A:
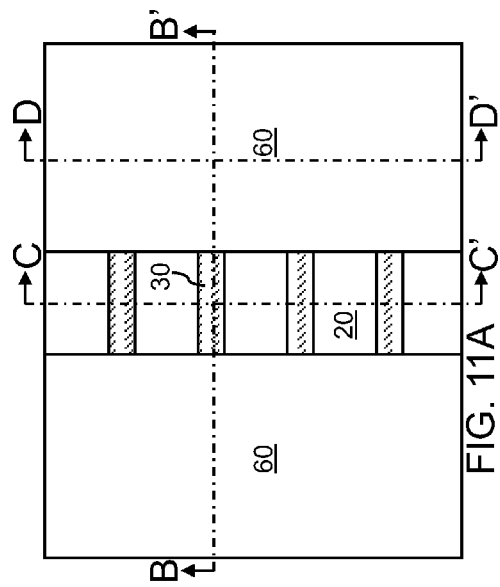
FIG. 11A is a top-down view of the second exemplary semiconductor structure after removal of physically exposed portions of the buffer semiconductor portion and the cap semiconductor portion according to the second embodiment of the present disclosure.
Figure 11C:
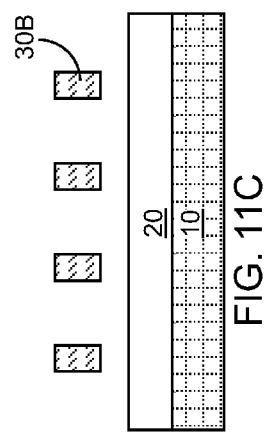
FIG. 11C is a vertical cross-sectional view of the second exemplary semiconductor structure along the vertical plane C-C' of FIG. 11A.

Referring to FIGS. 11A-11D, physically exposed portions of the buffer semiconductor portions 31 and the cap semiconductor portions 35 are removed by an isotropic etch, which can be a wet etch or a dry etch. The isotropic etch is selective to the first semiconductor material of the semiconductor fins (30S, 30D, 30B) and the dielectric material of the planarization dielectric layer 60.

Specifically, physically exposed portions of each cap semiconductor portion 35 are removed by the isotropic etch. The remaining portions of each cap semiconductor portions 35 become disjoined into two distinct portions, which include a first cap semiconductor portion 35S that envelops the source regions 30S, and a second cap semiconductor portion 35D that envelops the drain regions 30D.

Further, physically exposed portions of each buffer semiconductor portion 31 within the gate cavity 59 are removed by the isotropic etch. The remaining portions of each buffer semiconductor portion 31 become disjoined into two distinct portions, which include first buffer semiconductor material portions 31S and second buffer semiconductor material portions 31D. Each first buffer semiconductor portion 31S is in contact with a first portion of the top surface of the substrate (10, 20) and a bottom surface of a source region 30S. Each second buffer semiconductor portion 31D is in contact with a second portion of the top surface of the substrate (10, 20) and a bottom surface of a drain region 30D.

In one embodiment, physically exposed portions of each cap semiconductor portion 35 and physically exposed portions of each buffer material portions 31 can be removed by a crystallographic-orientation dependent etch, which provides different etch rates for different crystallographic orientations. The use of a crystallographic-orientation dependent etch can minimize the undesirable sideway etch that encroaches into the first buffer semiconductor material portions 31S and the second buffer semiconductor material portions 31D. A crystallographic-orientation dependent etch has the characteristic of having different etching rates for different crystallographic orientations. For example if the top surface of the insulator layer 20 is a (101) plane and if the semiconductor fins (30S, 30D, 30B) are defined to have sidewalls parallel to the (10$\bar{1}$) and ($\bar{1}$01) planes, the sidewalls of the first buffer semiconductor material portions 31S and the second buffer semiconductor material portions 31D that are perpendicular to the lengthwise direction of the semiconductor fins (30S, 30D, 30B) are parallel to the (010) plane and the (0$\bar{1}$0) plane. To suspend a center portion of each semiconductor fin (30S, 30D, 30B), a crystallographic-orientation dependent etch with a high etching rate along the <110> directions and a slow etching rate along the <100> planes direction may be used. This would allow the removal of the middle portion of each buffer semiconductor portion 31 with little encroachment into the first buffer semiconductor material portions 31S and the second buffer semiconductor material portions 31D.

Referring to FIGS. 12A-12D, a gate dielectric layer 50 and a gate electrode 52 are formed, for example, by performing the processing steps of FIGS. 6A-6D.

The second exemplary semiconductor structure contains at least one semiconductor fin (30S, 30D, 30B). Each semiconductor fin (30S, 30D, 30B) includes a first semiconductor material, and is located over a substrate (10, 20). Each semiconductor fin (30S, 30D, 30B) includes a source region 30S, drain region 30D, and a body region 30B laterally contacting the source region 30S and the drain region 30D. The second exemplary semiconductor structure further includes at least one first buffer semiconductor portion 31S and at least one second buffer semiconductor portion 31D. Each first buffer semiconductor portion 31S is in contact with a first portion of the top surface of the substrate (10, 20) and a bottom surface of a source region 30S. Each second buffer semiconductor portion 31D is in contact with a second portion of the top surface of the substrate (10, 20) and a bottom surface of a drain region 30D. A gate dielectric layer 50 and a gate electrode 52 laterally surround each body region 30B. Thus, the gate electrode 52 laterally surrounds each suspended portion of the semiconductor fins (30S, 30D, 30B).

For each body region 30B, a portion of the gate electrode 52 underlies the body region 30B. In one embodiment, the gate dielectric layer 50 can contact sidewalls of the first buffer semiconductor portions 31S and the second buffer semiconductor portions 31D.

In one embodiment, the sidewalls of the first cap semiconductor portions 35S can be laterally recessed relative to a sidewall of the planarization dielectric layer 60 within the gate cavity, and the sidewalls of the second cap semiconductor portions 35D can be laterally recessed relative to another sidewall of the planarization dielectric layer 60 within the gate cavity. In this case, a first gate electrode portion can laterally surrounding the body regions 30B and have a first width w1, and a second gate electrode portion can overlie the body regions 30B and have a second width w2 such that the first width w1 is greater than the second width w2.

Each first cap semiconductor portion 35S can be in contact with a top surface of a source region 30S. Each second cap semiconductor portion 35D can be in contact with a top surface of a drain region 30D.

In one embodiment, each semiconductor fin (30S, 30D, 30S) can extend along a lengthwise direction. A first end wall of each semiconductor fin (30S, 30D, 30B), i.e., an end wall of a source region 30S, and an end wall of the underlying first buffer semiconductor portion 31S can be within a same vertical plane, which is herein referred to as a first vertical plane. A second end wall of each semiconductor fin (30S, 30D, 30B), i.e., an end wall of a drain region 30D, and an end wall of the underlying second buffer semiconductor portion 31D can be within a same vertical plane, which is herein referred to as a second vertical plane.

In one embodiment, the first semiconductor material of the plurality of semiconductor fins (30S, 30D, 30B) can be single crystalline, the first buffer semiconductor portions 31S and the second buffer semiconductor portions 31D can include a second semiconductor material that is single crystalline. The first semiconductor material can be epitaxially aligned to the second semiconductor material in the first buffer semiconductor portions 31S and the second buffer semiconductor portions 31D. In one embodiment, the first semiconductor material can be a first III-V compound semiconductor material and the second semiconductor material can be a second III-V compound semiconductor material.

Figure 13A:
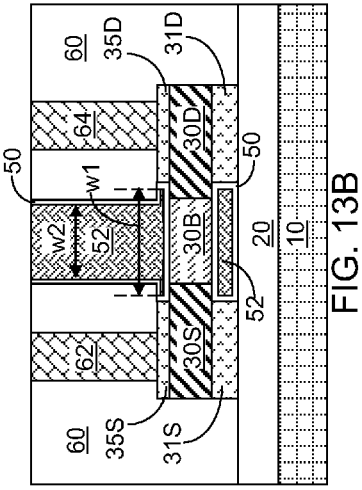
FIG. 13A is a top-down view of the second exemplary semiconductor structure after formation of contact via structures according to the second embodiment of the present disclosure.
Figure 13B:
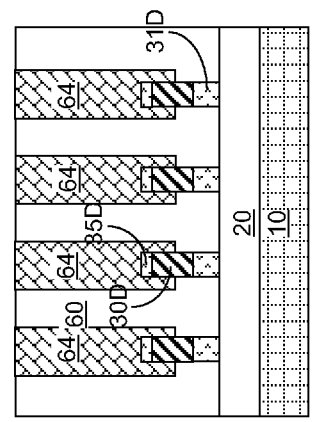
FIG. 13B is a vertical cross-sectional view of the second exemplary semiconductor structure along the vertical plane B-B' of FIG. 13A.
Figure 13C:
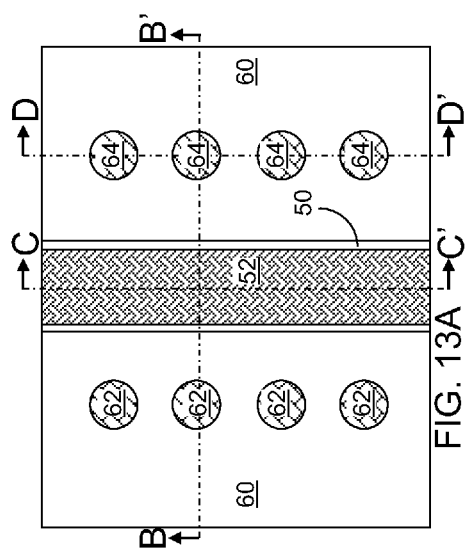
FIG. 13C is a vertical cross-sectional view of the second exemplary semiconductor structure along the vertical plane C-C' of FIG. 13A.
Figure 13D:
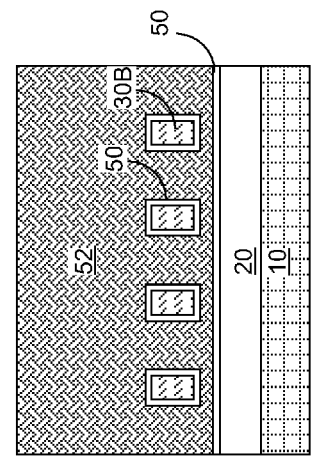
FIG. 13D is a vertical cross-sectional view of the second exemplary semiconductor structure along the vertical plane D-D' of FIG. 13A.

Referring to FIGS. 13A-13D, various contact via structures (62, 64) can be formed through the planarization dielectric layer 60. The various contact via structures (62, 64) extend through the planarization dielectric layer 60, and contact the source regions 30S or the drain regions 30D.

Figure 14A:
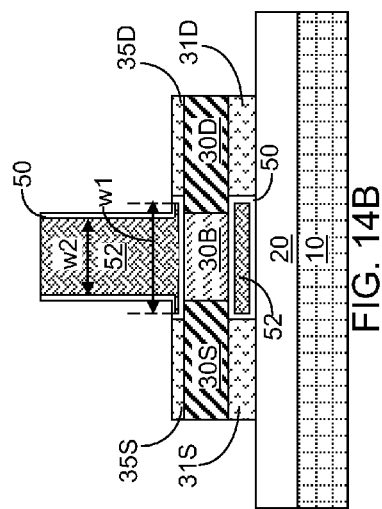
FIG. 14A is a vertical cross-sectional view of a third exemplary semiconductor structure after removal of the planarization dielectric layer according to a third embodiment of the present disclosure.
Figure 14B:
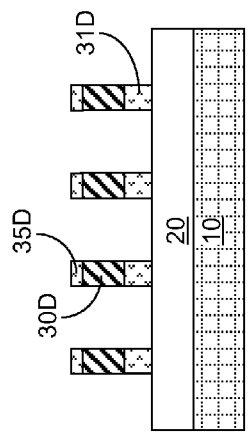
FIG. 14B is a vertical cross-sectional view of the third exemplary semiconductor structure along the vertical plane B-B' of FIG. 14A.
Figure 14C:
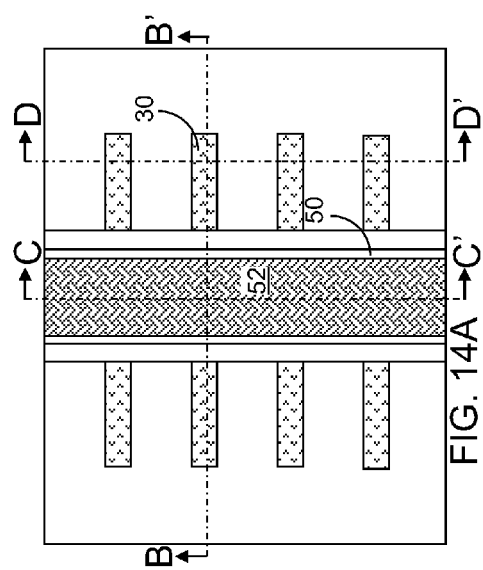
FIG. 14C is a vertical cross-sectional view of the third exemplary semiconductor structure along the vertical plane C-C' of FIG. 14A.
Figure 14D:
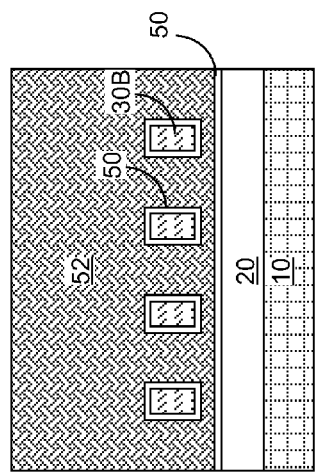
FIG. 14D is a vertical cross-sectional view of the third exemplary semiconductor structure along the vertical plane D-D' of FIG. 14A.

Referring to FIGS. 14A-14D, a third exemplary semiconductor structure according to a third embodiment of the present disclosure is illustrated. The third exemplary semiconductor structure can be derived from the second exemplary semiconductor structure of FIGS. 12A-12D by removing the planarization dielectric layer 60 selective to the gate electrode 52, the semiconductor fins (30S, 30D, 30B), the first and second cap semiconductor portions (35S, 35D), and first and second buffer semiconductor portions (31S, 31D). The removal of the planarization dielectric layer 60 can be performed, for example, by a wet etch.

Referring to FIGS. 15A-15B, a gate spacer 56 can be formed by a conformal deposition of a dielectric material layer and an anisotropic etch. The anisotropic etch removes horizontal portions of the deposited dielectric material layer and recesses vertical portions of the dielectric material layer. Remaining portions of the dielectric material layer laterally surrounds the gate electrode 52 and the gate dielectric layer 50, and constitutes the gate spacer 56. In one embodiment, the gate spacer 56 can contact sidewall surfaces of the gate dielectric layer 50 and a horizontal top surface of a portion of the gate dielectric layer 50 that overlie peripheral regions of the source regions 30S and the drain regions 30D.

Ion implantation is an effective and widely used method for doping semiconductors such as silicon (Si) and germanium (Ge). However, for some semiconductors such as InGaAs and InP ion implantation may not be the most effective way to dope the material. It was experimentally observed that post implantation dopant activation has a relatively low yield in these materials. An alternative method for forming heavily doped source regions 30S and drain regions 30D is by use of in-situ doped epitaxy. With this method, doped semiconductor material is added over the exposed portions of fins 30. The doped material is said to be added epitaxially, which means that the added semiconductor material assumes the same crystallographic structure and order as that of the semiconductor fins 30. The plurality of semiconductor fins 30 are therefore being used as a template for the growth of doped semiconductor material that forms the source regions 30S and the drain regions 30D. In one embodiment when enough doped semiconductor material is added to the plurality of semiconductor fins 30, the plurality of semiconductor fins 30 will eventually merge.

For example, when the plurality of semiconductor fins 30 are made of InGaAs, additional n-type doped InGaAs can be epitaxially added to the plurality of semiconductor fins 30. The addition (growth) of doped InGaAs can be done using methods such as metal-organic chemical vapor deposition (MOCVD), or metal-organic molecular beam epitaxy (MO-MBE). These deposition methods provide selective growth in the sense that InGaAs is added only over the plurality of semiconductor fins 30, but is not deposited over other surfaces such as the insulator layer 20 and the disposable gate structure 44. Examples of precursor that are used for MOCVD deposition of InGaAs are triethylgallium (TEG) and trimethylindium (TMI) for group III and arsine ($AsH_3$) for group V. To achieve n-type in-situ doping a precursor such as silicon tetrabromide ($SiBr_4$) is also added to the gas mixture during epitaxy. For p-type doping a precursor such as carbon tetrabromide ($CBr_4$) can be used. We further note that the added doped semiconductor does not need to be identical in composition to that forming the plurality of semiconductor fins 30. Using the above example, doped InAs can be epitaxially added over the semiconductor fins 30 to make the doped source regions 30S and the drain regions 30D.

Figure 16B:
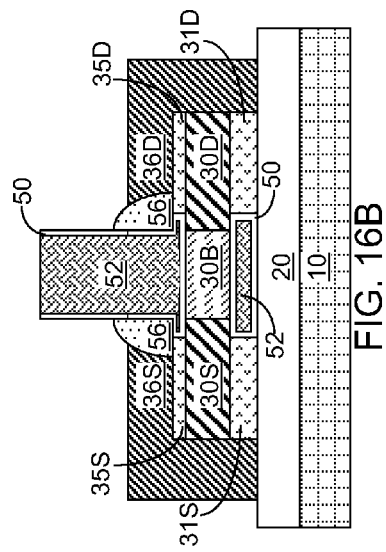
FIG. 16B is a vertical cross-sectional view of the third exemplary semiconductor structure along the vertical plane B-B' of FIG. 16A.
Figure 16D:
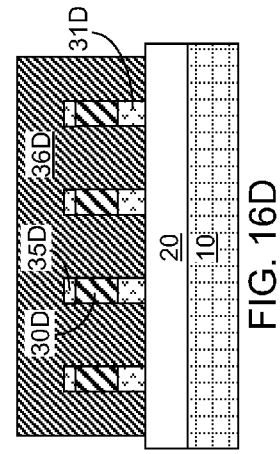
FIG. 16D is a vertical cross-sectional view of the third exemplary semiconductor structure along the vertical plane D-D' of FIG. 16A.
Figure 16A:
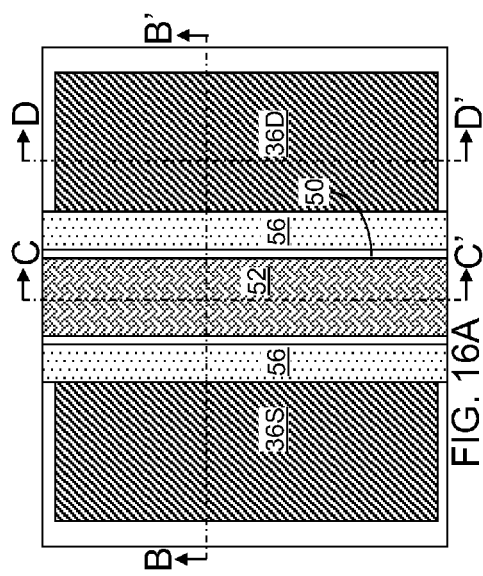
FIG. 16A is a top-down view of the third exemplary semiconductor structure after formation of a raised source region and a raised drain region according to the third embodiment of the present disclosure.
Figure 16C:
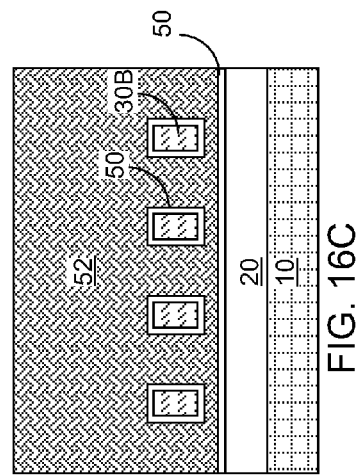
FIG. 16C is a vertical cross-sectional view of the third exemplary semiconductor structure along the vertical plane C-C' of FIG. 16A.

In this case, a raised source region 36S and a raised drain region 36D can be formed on sidewalls of remaining portions of the buffer semiconductor portion 31, i.e., the first and second buffer semiconductor portions (31S, 31D), and physically exposed sidewalls of the semiconductor fins (30S, 30D, 30B) as illustrated in FIGS. 16A-16D. The raised source region 36S and the raised drain region 36D can be formed, for example, by selective deposition of a semiconductor material. During the selective deposition, at least one reactant including a semiconductor precursor material and at least one etchant are concurrently or alternately flowed into a process chamber including the variation of the first exemplary semiconductor structure so that the semiconductor material is deposited on the semiconductor surfaces of the semiconductor fins (30S, 30D, 30B), the first and second buffer semiconductor portions (31S, 31D), and the first and second cap semiconductor portions (35S, 35D) without nucleating the semiconductor material on dielectric surfaces such as the surfaces of the gate dielectric layer 50, the insulator layer 20, or on the metallic surfaces of the gate electrode 52. In one embodiment, the selective deposition can be selective epitaxy, and the raised source region 36S and the raised drain region 36D can include a single crystalline semiconductor material. When in-situ doped epitaxy is used to define the source and drain 30S and 30D, the disposable gate structure 44 blocks the deposition of doped semiconductor material over the channel region. Embodiments in which each of the raised source region 36S and the raised drain region 36D are formed as multiple disjoined structures that do not merge among one another are expressly contemplated herein.

The semiconductor material of the raised source region 36S and the raised drain region 36D can be deposited with in-situ doping with dopants of a conductivity type, which can be p-type or n-type. The conductivity type of the raised source region 36S and the raised drain region 36D can be the same as the conductivity type of the source regions 30S and the drain regions 30D. Alternately, the semiconductor material of the raised source region 36S and the raised drain region 36D can be deposited as an intrinsic semiconductor material and subsequently doped with dopants. In one embodiment, each of the raised source region 36S and the raised drain region 36D can be formed by merging of multiple deposited semiconductor portions as the thickness of the deposited semiconductor material exceeds one half of the spacing between adjacent pairs of semiconductor fins (30S, 30D, 30B).

The raised source region 36S is in contact with sidewall surfaces of each source region 30S and sidewall surfaces of each first buffer semiconductor portion 31S. The raised drain region 36D is in contact with sidewall surfaces of each drain region 30D and sidewall surfaces of each second buffer semiconductor portion 31D. For each semiconductor fin (30S, 30D, 30B), vertical interfaces between the source region 30S and the raised source region 36S, vertical interfaces between the drain region 30D and the raised drain region 36D, and vertical interfaces between the body region 30B and the gate dielectric layer 50 in contact with the semiconductor fin (30S, 30D, 30B) can be within a pair of vertical planes. Further, for each semiconductor fin (30S, 30D, 30B), a horizontal interface between the source region 30S and the raised source region 36S and a horizontal interface between the drain region 30D and the raised drain region 36D can be within the same horizontal plane as the horizontal interface between the semiconductor fin (30S, 30D, 30B) and the gate dielectric layer 50.

Referring to FIGS. 17A-17D, a contact level dielectric layer 80 can be deposited over the raised source region 36S and the raised drain region 36D, and planarized employing the gate electrode 52 as a stopping structure. Various contact via structures (62, 64) can be subsequently formed through the contact level dielectric layer 80, which is a dielectric material layer including a dielectric material such as silicon oxide, silicon nitride, silicon oxynitride, and/or organosilicate glass.

Figure 18B:
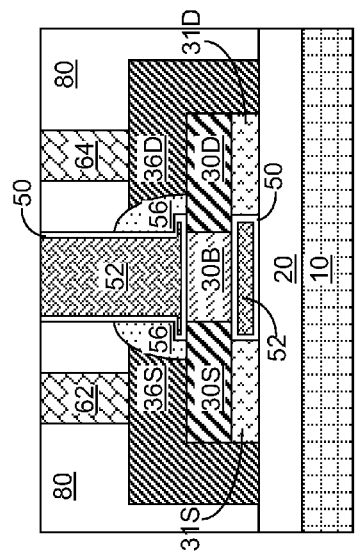
FIG. 18B is a vertical cross-sectional view of the third exemplary semiconductor structure along the vertical plane B-B' of FIG. 18A.
Figure 18D:
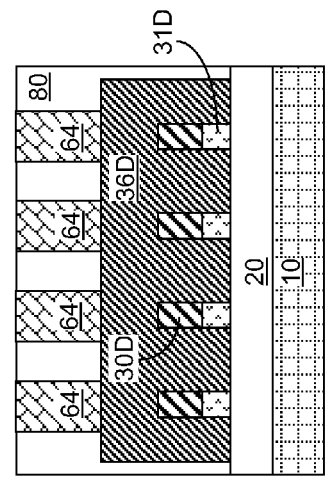
FIG. 18D is a vertical cross-sectional view of the third exemplary semiconductor structure along the vertical plane D-D' of FIG. 18A.
Figure 18A:
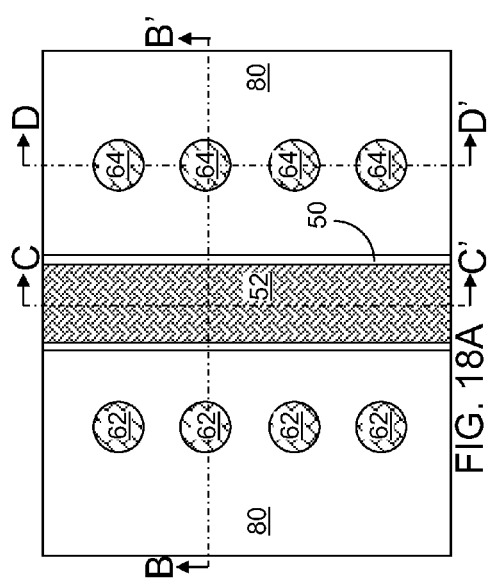
FIG. 18A is a top-down view of a first variation of the third exemplary semiconductor structure according to the third embodiment of the present disclosure.
Figure 18C:
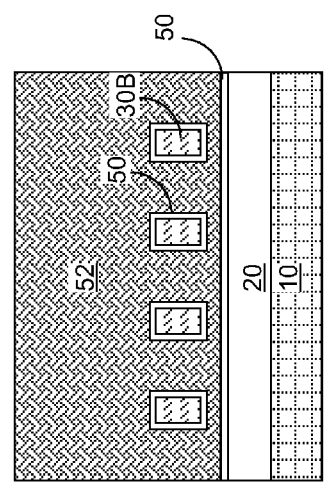
FIG. 18C is a vertical cross-sectional view of the third exemplary semiconductor structure along the vertical plane C-C' of FIG. 18A.

Referring to FIGS. 18A-18D, a first variation of the third exemplary semiconductor structure can be derived from the third exemplary semiconductor structure by removing the first and second cap semiconductor portions (35S, 35D; See FIGS. 12A-12D) during, or after, removal of the planarization dielectric layer 60 and before formation of a gate spacer 56. The removal of the first and second cap semiconductor portions can be performed by an anisotropic etch or an isotropic etch.

Figure 19B:
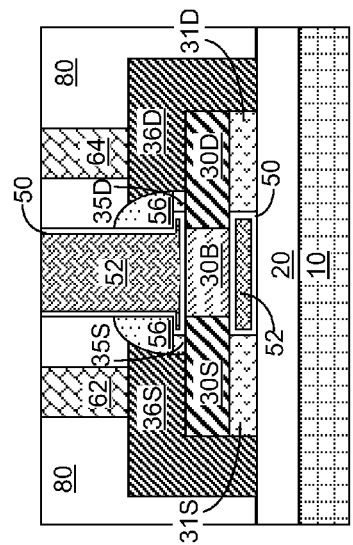
FIG. 19B is a vertical cross-sectional view of the third exemplary semiconductor structure along the vertical plane B-B' of FIG. 19A.
Figure 19D:
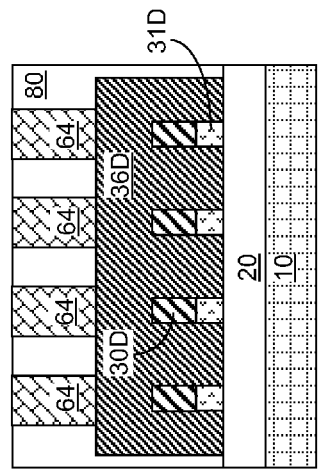
FIG. 19D is a vertical cross-sectional view of the third exemplary semiconductor structure along the vertical plane D-D' of FIG. 19A.
Figure 19A:
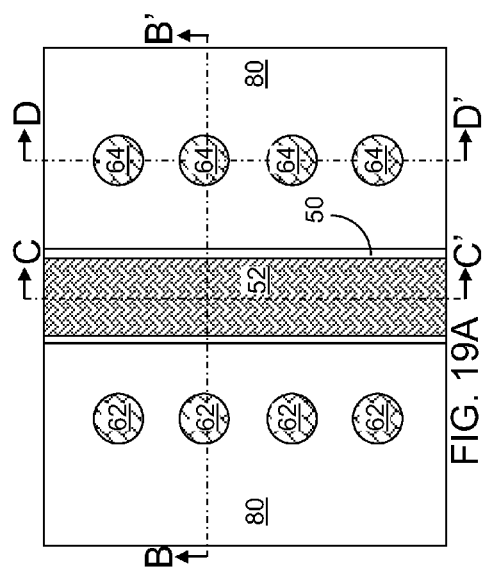
FIG. 19A is a top-down view of a second variation of the third exemplary semiconductor structure according to the third embodiment of the present disclosure.
Figure 19C:
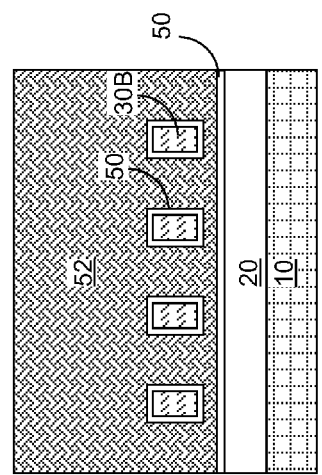
FIG. 19C is a vertical cross-sectional view of the third exemplary semiconductor structure along the vertical plane C-C' of FIG. 19A.

Referring to FIGS. 19A-19D, a second variation of the third exemplary semiconductor structure can be derived from the third exemplary semiconductor structure by removing physically exposed portions of the first and second cap semiconductor portions (35S, 35D; See FIGS. 12A-12D) after formation of a gate spacer 56. The gate spacer 56 can be employed as an etch mask to remove the portions of the first and second cap semiconductor portions that are not covered by the gate spacer 56. The removal of the physically exposed portions of the first and second cap semiconductor portions (35S, 35D) can be performed by an anisotropic etch or an isotropic etch. If an anisotropic etch is employed to remove the physically exposed portions of the first and second cap semiconductor portions (35S, 35D), sidewalls of the remaining portions of the first and second cap semiconductor portions (35S, 35D) can be vertically coincident with bottom portions of the sidewalls of the gate spacer 56. As used herein, two surfaces are vertically coincident if there exists a vertical plane that includes the two surfaces.

Referring to FIGS. 20A-20D, a third variation of the third exemplary semiconductor structure can be derived from the third exemplary semiconductor structure of FIGS. 15A-15D by removing the first and second buffer semiconductor portions (31S, 31D) and the first and second cap semiconductor portions (35S, 35D) selective to the semiconductor fins (30S, 30D, 30B), the gate spacer 56, and the gate electrode 52. In this case, portions of the raised source region 36S can underlie the source regions 30S, and portions of the raised drain region 36D can underlie the drain regions 30D.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
 a semiconductor fin of a first semiconductor material located over a substrate and having a uniform width throughout, said semiconductor fin comprising a source region, a drain region, and a body region laterally contacting said source region and said drain region;
 a first buffer semiconductor portion of a second semiconductor material in contact with a first portion of a top surface of said substrate and a bottom surface of said source region;
 a second buffer semiconductor portion of said second semiconductor material in contact with a second portion of said top surface of said substrate and a bottom surface of said drain region;
 a gate dielectric layer and a gate electrode that laterally surround said body region;
 at least one source-side semiconductor shell layer contacting a top surface and sidewalls of said source region; and
 at least one drain-side semiconductor shell layer contacting a top surface and sidewalls of said drain region,
 wherein said first semiconductor material is a first III-V compound semiconductor material and said second semiconductor material is a second III-V compound semiconductor material.

2. The semiconductor structure of claim 1, wherein a portion of said gate electrode underlies said body region.

3. The semiconductor structure of claim 1, wherein said gate dielectric layer contacts sidewalls of said first buffer semiconductor portion and said second buffer semiconductor portion.

4. The semiconductor structure of claim 1, wherein said gate electrode comprises:
- a first gate electrode portion laterally surrounding said body region and having a first width; and
- a second gate electrode portion overlying said body region and having a second width, wherein said first width is greater than said second width.

5. The semiconductor structure of claim 1, wherein said semiconductor fin extends along a lengthwise direction, a first end wall of said semiconductor fin and an end wall of said first buffer semiconductor portion are within a first vertical plane, and a second end wall of said semiconductor fin and an end wall of said second buffer semiconductor portion are within a second vertical plane.

6. The semiconductor structure of claim 1, wherein said first semiconductor material is single crystalline, said second semiconductor material is single crystalline, and said first semiconductor material is epitaxially aligned to said second semiconductor material in said first buffer semiconductor portion and said second buffer semiconductor portion.

7. A semiconductor structure comprising:
- a semiconductor fin located over a substrate and having a uniform width throughout, said semiconductor fin comprising a source region, a drain region, and a body region laterally contacting said source region and said drain region;
- a first buffer semiconductor portion in contact with a first portion of a top surface of said substrate and a bottom surface of said source region;
- a second buffer semiconductor portion in contact with a second portion of said top surface of said substrate and a bottom surface of said drain region;
- a gate dielectric layer and a gate electrode that laterally surround said body region;
- at least one source-side semiconductor shell layer contacting a top surface and sidewalls of said source region; and
- at least one drain-side semiconductor shell layer contacting a top surface and sidewalls of said drain region.

8. The semiconductor structure of claim 7, wherein a portion of said gate electrode underlies said body region.

9. The semiconductor structure of claim 7, wherein said gate dielectric layer contacts sidewalls of said first buffer semiconductor portion and said second buffer semiconductor portion, and sidewalls of said at least one source-side semiconductor shell layer and said at least one drain-side semiconductor shell layer.

10. The semiconductor structure of claim 7, wherein said gate electrode comprises:
- a first gate electrode portion laterally surrounding said body region and having a first width; and
- a second gate electrode portion overlying said body region and having a second width, wherein said first width is greater than said second width.

11. The semiconductor structure of claim 7, wherein said semiconductor fin extends along a lengthwise direction, a first end wall of said semiconductor fin and an end wall of said first buffer semiconductor portion are within a first vertical plane, and a second end wall of said semiconductor fin and an end wall of said second buffer semiconductor portion are within a second vertical plane.

12. The semiconductor structure of claim 7, wherein said semiconductor fin comprises a first semiconductor material that is single crystalline, said first buffer semiconductor portion and said second buffer semiconductor portion comprise a second semiconductor material that is single crystalline, and said first semiconductor material is epitaxially aligned to said second semiconductor material in said first buffer semiconductor portion and said second buffer semiconductor portion.

13. The semiconductor structure of claim 12, wherein said first semiconductor material is a first III-V compound semiconductor material and said second semiconductor material is a second III-V compound semiconductor material.

* * * * *